(12) United States Patent
Park et al.

(10) Patent No.: US 7,130,003 B2
(45) Date of Patent: Oct. 31, 2006

(54) THIN FILM TRANSISTOR ARRAY SUBSTRATE FOR A LIQUID CRYSTAL DISPLAY AND THE METHOD FOR FABRICATING THE SAME

(75) Inventors: Woon-Yong Park, Suwon (KR); Hyeon-Hwan Kim, Cheonan (KR); Dong-Hyeon Ki, Cheonan (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/126,305

(22) Filed: May 11, 2005

(65) Prior Publication Data

US 2005/0208711 A1  Sep. 22, 2005

Related U.S. Application Data

(60) Continuation of application No. 10/626,738, filed on Jul. 25, 2003, now Pat. No. 6,906,776, which is a division of application No. 09/779,705, filed on Feb. 9, 2001, now Pat. No. 6,678,018.

(30) Foreign Application Priority Data

Feb. 10, 2000 (KR) .............................. 2000-6273
Apr. 24, 2000 (KR) .............................. 2000-21693

(51) Int. Cl.
*G02F 1/1333* (2006.01)
*G02F 1/1343* (2006.01)
*H01L 21/00* (2006.01)

(52) U.S. Cl. .................................. 349/54; 349/141
(58) Field of Classification Search ................ 349/43, 349/141, 192, 139, 54, 55, 147, 148
See application file for complete search history.

(56) References Cited

U.S. PATENT DOCUMENTS

| 4,960,719 A | 10/1990 | Tanaka et al. ............... 438/158 |
| 5,034,339 A | 7/1991 | Tanaka et al. ............... 438/158 |
| 5,034,340 A | 7/1991 | Tanaka et al. ............... 438/158 |
| 5,045,485 A | 9/1991 | Tanaka et al. ............... 438/158 |
| 5,065,202 A | 11/1991 | Tanaka et al. ................ 257/59 |
| 5,272,355 A | 12/1993 | Namavar et al. ............... 257/3 |
| 5,482,173 A | 1/1996 | Park et al. .................... 216/23 |
| 5,703,668 A | 12/1997 | Shin ........................... 349/110 |

(Continued)

*Primary Examiner*—Andrew Schechter
*Assistant Examiner*—David Y. Chung
(74) *Attorney, Agent, or Firm*—MacPherson Kwok Chen & Heid LLP

(57) ABSTRACT

A method for fabricating a thin film array substrate for a liquid crystal display includes steps of forming a gate line assembly and a common electrode line assembly on a first substrate. The gate line assembly includes a plurality of gate lines and gate pads, and the common electrode line assembly includes common signal lines and common electrodes. Thereafter, a gate insulating layer is formed on the first substrate, and a semiconductor pattern and an ohmic contact pattern are formed on the gate insulating layer. A data line assembly and pixel electrodes are then formed on the first substrate. The data line assembly includes a plurality of data lines, data pads, and source and drain electrodes. The pixel electrodes are connected to the drain electrodes while proceeding parallel to the common electrodes. A passivation layer is formed on the substrate. The passivation layer and the gate insulating layer are etched such that the gate pads and the data pads are exposed to the outside. At this time, the etching is performed after an assembly process where a second substrate is arranged to face the first substrate and assembled together and the passivation layer and the gate insulating layer are exposed outside of the second substrate.

4 Claims, 37 Drawing Sheets

U.S. PATENT DOCUMENTS

| | | | |
|---|---|---|---|
| 5,907,379 A | 5/1999 | Kim et al. | 349/141 |
| 5,929,958 A | 7/1999 | Ohta et al. | 349/141 |
| 6,133,977 A * | 10/2000 | Lee et al. | 349/141 |
| 6,215,541 B1 * | 4/2001 | Song et al. | 349/141 |
| 6,287,899 B1 * | 9/2001 | Park et al. | 438/149 |
| 6,391,499 B1 | 5/2002 | Kim et al. | 430/5 |
| 6,633,359 B1 * | 10/2003 | Zhang et al. | 349/141 |
| 6,806,499 B1 | 10/2004 | Yamazaki et al. | 257/72 |
| 6,816,209 B1 | 11/2004 | Tsujimura et al. | 349/43 |
| 6,822,702 B1 | 11/2004 | Chapman et al. | 340/43 |

* cited by examiner

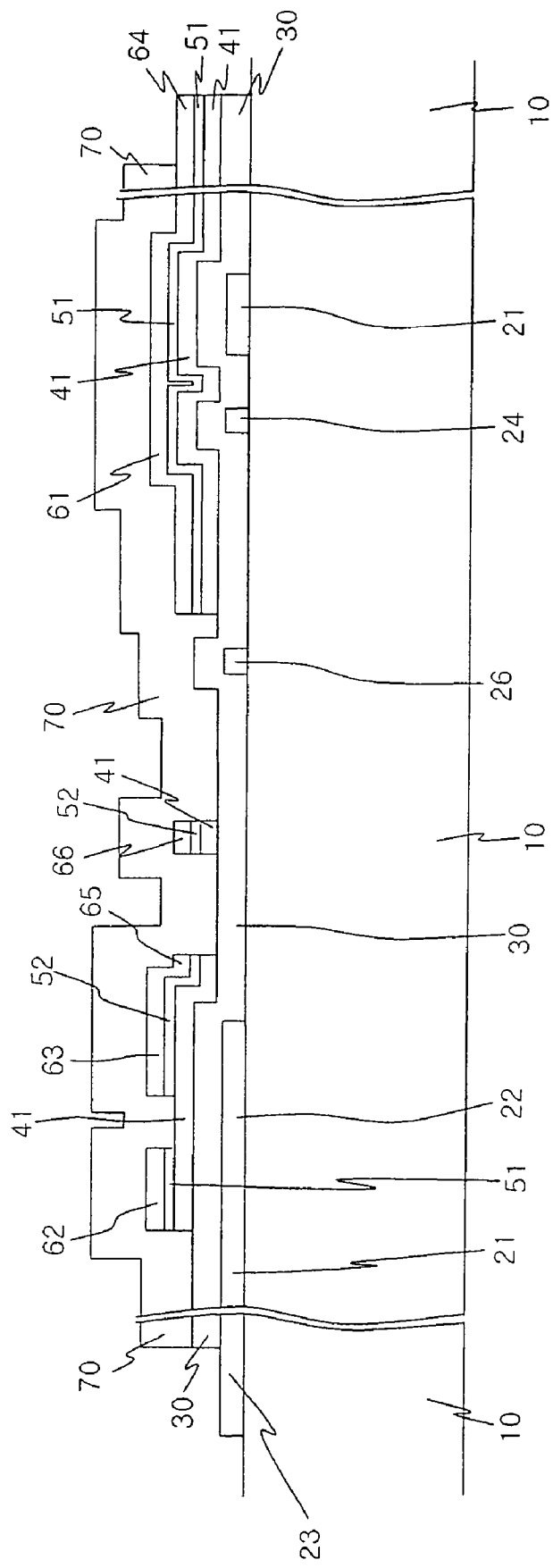

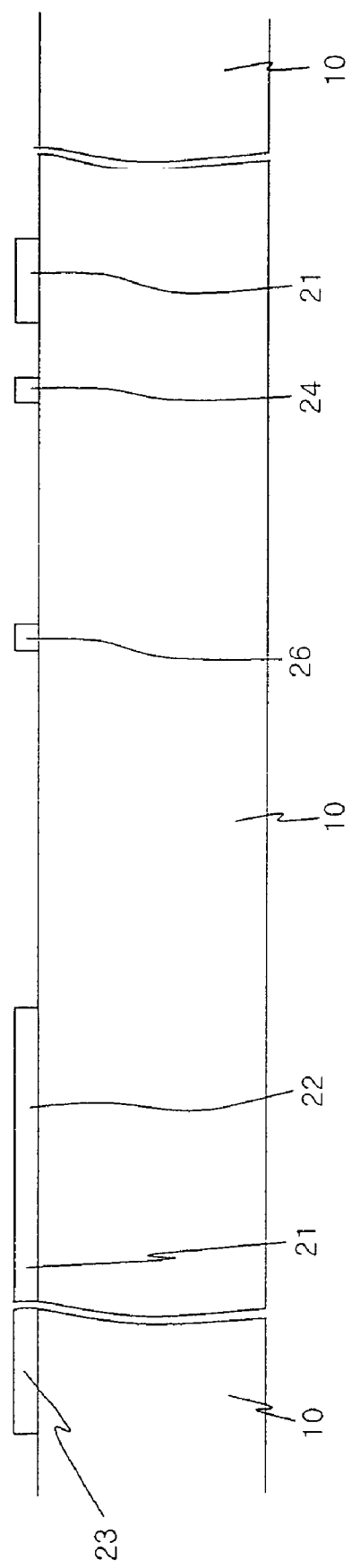

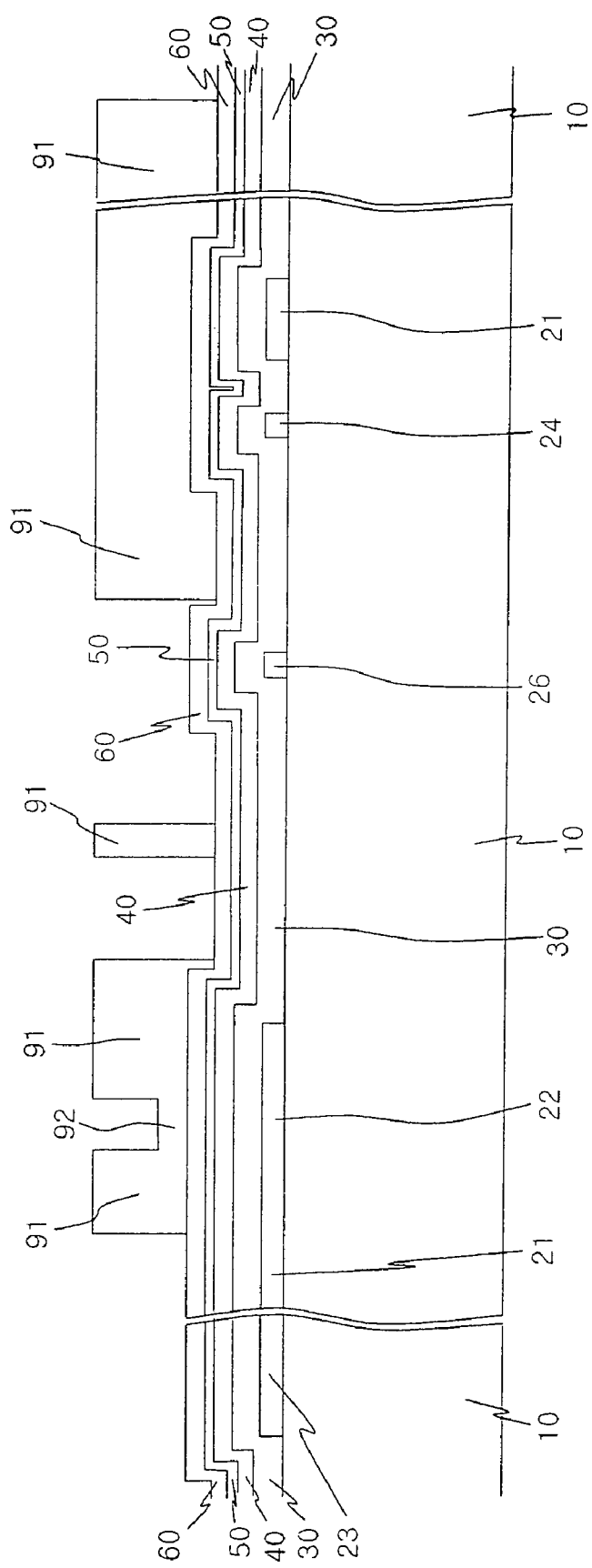

THIN FILM TRANSISTOR ARRAY SUBSTRATE FOR A LIQUID CRYSTAL DISPLAY AND THE METHOD FOR FABRICATING THE SAME

CROSS REFERENCE TO RELATED APPLICATIONS

This application is a continuation of U.S. patent application Ser. No. 10/626,738, filed on Jul. 25, 2003, now U.S. Pat. No. 6,906,776 which is a divisional application of U.S. patent application Ser. No. 09/779,705, filed on Feb. 9, 2001, now U.S. Pat. No. 6,678,018 which claims the benefit of Korean Patent Application No. 2000-6273, filed on Feb. 10, 2000 and Korean Patent Application No. 2000-21693, filed on Apr. 24, 2000, all of which are hereby incorporated by reference for all purposes as if fully set forth herein.

BACKGROUND OF THE INVENTION (a) Field of the Invention

The present invention relates to a thin film transistor (TFT) array substrate for a liquid crystal display, and a method for fabricating the same.

(b) Description of the Related Art

A liquid crystal display is one of flat panel display devices that has been currently used in a most extensive manner. The liquid crystal display has two substrates, and a liquid crystal layer sandwiched between the substrates. One of the substrates is provided with thin film transistors (TFTs), and pixel electrodes. The TFT array substrate is fabricated through forming thin films on the substrate, and repeatedly performing photolithography on the thin films.

The number of masks employed in the photolithography process that represents the number of processing steps becomes to be a critical factor to reduce the production cost. In order to lower the production cost, it is required that the number of masks for the photolithography process should be reduced.

SUMMARY OF THE INVENTION

It is an object of the present invention to provide a method for fabricating a TFT array substrate for a liquid crystal display, which involves simplified processing steps.

This and other objects may be achieved by a method for fabricating a TFT array substrate for a liquid crystal display where a data line assembly, pixel electrodes and a semiconductor pattern are formed at only one photolithography process.

The method for fabricating a TFT array substrate for a liquid crystal display includes the step of forming a gate line assembly and a common electrode line assembly on a first substrate. The gate line assembly includes a plurality of gate lines and gate pads, and the common electrode line assembly includes common signal lines and common electrodes. Thereafter, a gate insulating layer is formed on the first substrate, and a semiconductor pattern and an ohmic contact pattern are formed on the gate insulating layer. A data line assembly and pixel electrodes are then formed on the first substrate. The data line assembly includes a plurality of data lines, data pads, and source and drain electrodes. The pixel electrodes are connected to the drain electrodes while proceeding parallel to the common electrodes. A passivation layer is formed on the substrate. The passivation layer and the gate insulating layer are etched such that the gate pads and the data pads are exposed to the outside. At this time, the etching is performed after an assembly process where a second substrate is arranged to face the first substrate, and the passivation layer and the gate insulating layer are exposed externally to the second substrate.

Alternatively, the step of exposing the gate and the data pads may be performed after the step of injecting liquid crystal molecules in-between the first and the second substrates facing each other, and sealing the gap between the first and second substrates. Furthermore, a sealant may be partially coated onto the gate and the data pads.

The steps of forming the data line assembly, the pixel electrodes, the ohmic contact pattern and the semiconductor pattern are made through photolithography based on one photoresist pattern having different thickness. The photoresist pattern has a first portion placed between the source and the drain electrodes with a predetermined thickness, a second portion for forming the data line assembly and the pixel electrodes that is thicker than the first portion, and a third portion that is thinner than the first portion.

The photoresist pattern is formed using a mask with a thin film with a light transmission of 20 to 50% corresponding to the first portion of the photoresist pattern, and a thin film with a light transmission of 3% or less corresponding to the second portion of the photoresist pattern.

Alternatively, the photoresist pattern may be made using a mask with a minute pattern corresponding to the area between the source and the drain electrodes while bearing an opening width smaller than the resolution of a light exposing device. The minute pattern may be either a slit pattern or a mosaic pattern with an opening width of 2µm or less.

Furthermore, supplemental data lines are formed at the step of forming the gate line assembly, and first contact holes exposing the supplemental data lines are formed at the step of forming the gate insulating layer. The steps of forming the ohmic contact pattern, the semiconductor pattern and the first contact holes are made through a photolithography based on one photoresist pattern having different in thickness. The photoresist pattern has a first portion corresponding to the ohmic contact pattern and the semiconductor pattern with a predetermined thickness, a second portion that is thicker than the first portion, and a third portion corresponding to the first contact holes that is thinner than the first portion.

The pixel electrodes are formed in a linear shape while proceeding parallel to the common electrodes.

The method further includes the step of forming one or more light interception patterns to be placed at the same plane as the gate lines with the same material such that each light interception pattern is separated from the gate line and positioned close to the neighboring subsidiary data line while proceeding parallel thereto. The pixel electrodes are partially overlapped with the light interception patterns. Alternatively, the pixel electrodes may be spaced apart from the light interception patterns by 2 µm or less.

The method further includes the steps of forming a gate short circuit line such that the gate short circuit line is connected to the gate pads, forming a second contact hole at the gate insulating layer such that the second contact hole exposes the gate short circuit line, and forming a data short circuit line such that the data short circuit line is connected to the data pads, the data short circuit line being connected to the gate short circuit line through the second contact hole.

In the meantime, the liquid crystal display includes a first substrate, and a gate line assembly and a common electrode line assembly formed on the first substrate. The gate line assembly includes a plurality of gate lines proceeding in the horizontal direction and gate pads connected to the gate lines, and the common electrode line assembly includes common signal lines proceeding parallel to the gate lines and common electrodes connected to the common signal lines while proceeding in the vertical direction. A gate insulating layer covers the gate line assembly and the common electrode line assembly, and a semiconductor pattern is formed on the gate insulating layer. An ohmic contact pattern is formed on the semiconductor pattern. A data line assembly and pixel electrodes are further formed at the first substrate. The data line assembly includes a plurality of data lines formed on the gate insulating layer and the ohmic contact pattern while crossing over the gate lines to form pixel regions, data pads connected to the data lines, source electrodes being parts of or branched from the data lines, and drain electrodes separated from the source electrodes. The pixel electrodes are connected to the drain electrodes at the pixel regions while proceeding parallel to the common electrodes. A passivation layer covers the data line assembly and the pixel electrodes. A second substrate faces the first substrate. The gate insulating layer and the passivation layer exposed externally to the second substrate and the data pads are removed.

The ohmic contact pattern has the same shape as the data line assembly and the pixel electrodes, and the semiconductor pattern has the same shape as the data line assembly and the pixel electrodes except for the area between the source and the drain electrodes.

Furthermore, subsidiary data lines are formed at the same plane as the gate line assembly with the same material, and first contact holes are formed on the gate insulating layer while exposing the subsidiary data lines.

Each pixel electrode is formed with two or more linear electrode portions, and each linear electrode portion is positioned close to the neighboring data line. Both ends of the linear electrode portions are connected to each other such that the pixel electrode bears a ring shape.

Furthermore, one or more light interception patterns are separated from the gate lines, and positioned close to the subsidiary data lines while proceeding parallel to the subsidiary data lines. The pixel electrodes are partially overlapped with the light interception patterns. Alternatively, the pixel electrodes are spaced apart from the light interception patterns by 2 µm or less.

On the other hand, in another method of fabricating a TFT array substrate for a liquid crystal display according to the present invention, the shadow frame is used to prevent the semiconductor layer, or the gate insulating layer from being deposited on the gate pad portion.

The method of fabricating a thin film transistor array substrate for a liquid crystal display includes the step of forming a gate line assembly and a common electrode line assembly on a substrate including a display areas and a peripheral areas. The gate line assembly comprises a plurality of gate lines and gate electrode of the display areas, and gate pads of the peripheral areas, and the common electrode line assembly comprises common signal lines and common electrodes of the display areas. Next, a gate insulating layer covering the gate line assembly exposing the portions of the gate pads is formed, and the a semiconductor pattern and an ohmic contact pattern are formed on the gate insulating layer. A data line assembly and pixel electrodes are then formed on the substrate. The data line assembly includes a plurality of data lines, and source and drain electrodes of the display areas, and data pads of the peripheral areas. The pixel electrodes are connected to the drain electrodes while proceeding parallel to the common electrodes. Here, when forming a gate insulating layer, the shadow frame having a first blocking deposition areas is used to prevent the gate insulating layer from being deposited on the gate pad portion having the gate pads of the peripheral areas.

The shadow frame may have a second blocking deposition areas to prevent the gate insulating layer, the semiconductor pattern, or the ohmic contact pattern from being deposited on the data pad portion having the data pads of the peripheral areas.

the data line assembly, the pixel electrodes, the ohmic contact pattern and the semiconductor pattern may be made through photolithography based on one photoresist pattern having a different thickness. It is preferable that the photoresist pattern has a first portion placed between the source and the drain electrodes with a predetermined thickness, a second portion for forming the data line assembly and the pixel electrodes that is thicker than the first portion, and a third portion that is thinner than the first portion.

The data line assembly, the ohmic contact pattern and the semiconductor pattern may be made through a photolithography process using one mask. First, the gate insulating layer, a semiconductor layer, an ohmic contact layer, and a conductor layer are deposited, and a photoresist layer is coated on the conductor layer. Next, the photoresist layer is exposed to light through the mask to form a photoresist pattern such that the second portion lies on the data line assembly by developing the photoresist layer. The data line assembly, the ohmic contact layer pattern, and the semiconductor pattern respectively made of the conductor layer, the ohmic contact layer and the semiconductor layer are formed by removing a portion of the conductor layer under the third portion, the semiconductor layer and the ohmic contact layer thereunder, the first portion, the conductor layer and the ohmic contact layer under the first portion, and a partial thickness of the second portion, and the photoresist pattern is removed. In detail, the portion of the conductor layer under the third portion is removed by dry or wet etching to expose the ohmic contact layer, and the ohmic contact layer under the third portion, the semiconductor layer thereunder and the first portion are dry-etched to obtain a complete semiconductor pattern along with exposing the gate insulating layer under the third portion and the conductor layer under the first portion. The conductor layer under the first portion and the ohmic contact layer thereunder are removed to obtain a complete data wire and complete ohmic contact layer pattern.

The shadow frame may be used to prevent the semiconductor layer, the ohmic contact layer, or the conductor layer from being deposited on the gate pad portion of the peripheral areas when depositing the semiconductor layer, the ohmic contact layer, and the conductor layer, and the photoresist pattern may have a fourth portion placed on the gate pad portions, and having the thickness of the first, the second, or the third portion.

A mask used for forming the photoresist pattern has a first, a second, and a third part. It is preferable that the transmittance of the third part is higher than the first and the second parts, the transmittance of the first part is higher than the second part, the photoresist pattern is made of positive photoresist, and the mask is aligned such that the first, the second, and the third parts respectively face the first, the second, and the third portions of the photoresist pattern in an exposing step.

It is preferable that the first part of the mask includes a partially transparent layer, or a plurality of slit patterns smaller than the resolution of the exposure device used in the exposing step, and the first portion is formed by reflow.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or the similar components, wherein:

FIG. 5 is a cross sectional view of the TFT array substrate taken along the V–V' line of FIG. 4;

FIG. 6B is a cross sectional view of the TFT array substrate taken along the VIb–VIb' line of FIG. 6A;

FIGS. 7B to 10 are cross sectional views of the TFT array substrate taken along the VIIb–VIIb' line of FIG. 7A sequentially illustrating the steps of fabricating the TFT array substrate;

FIGS. 14B to 17 are cross sectional views of the TFT array substrate taken along the XIVb–XIVb' line of FIG. 14A;

DETAILED DESCRIPTION OF THE PREFERRED EMBODIMENTS

Preferred embodiments of this invention will be explained with reference to the accompanying drawings.

Figure 1:
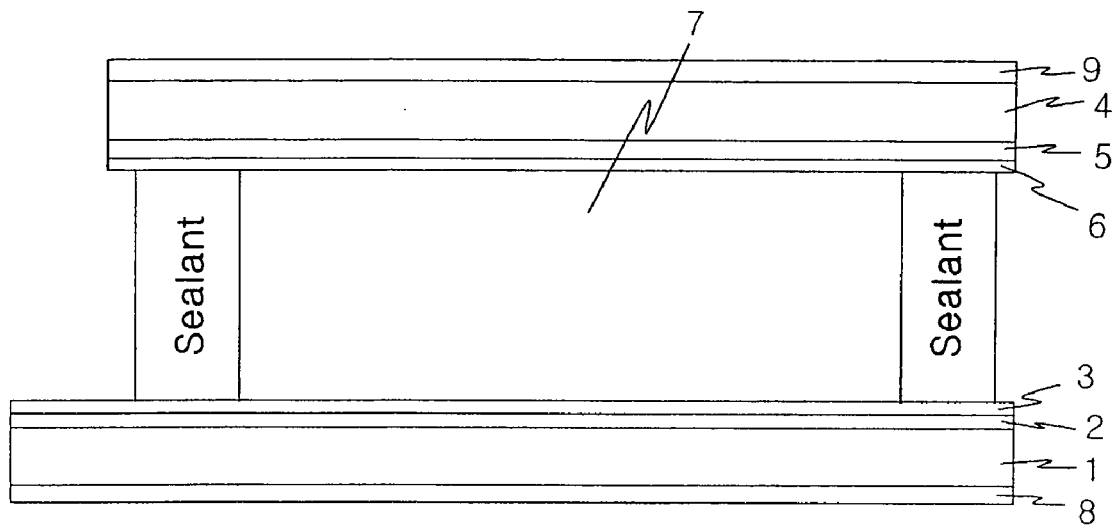
FIG. 1 is a cross sectional view of a liquid crystal display with upper and lower substrates according to the present invention.
Figure 2:
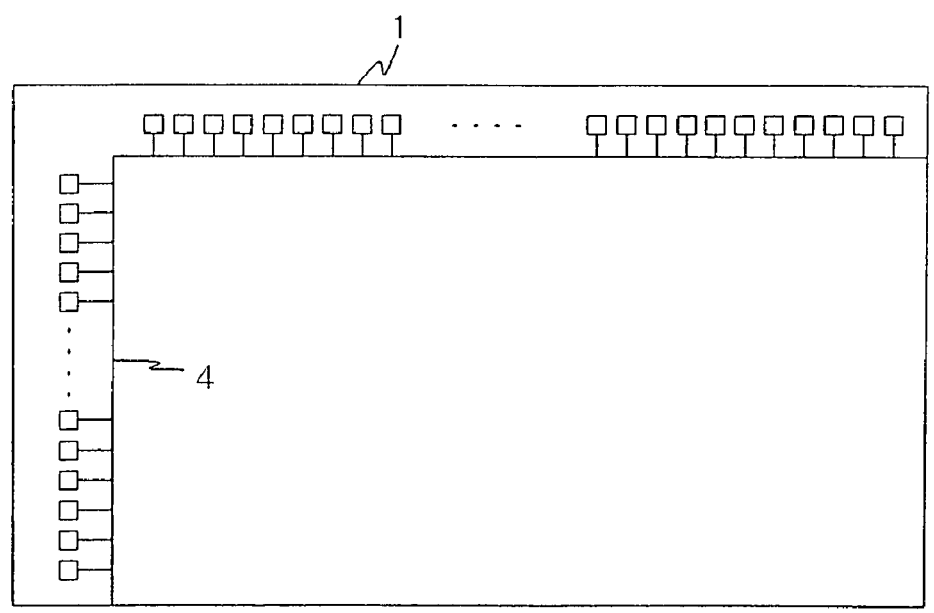
FIG. 2 is a plan view of the liquid crystal display shown in FIG. 1.

FIG. 1 is a cross sectional view of a liquid crystal display with upper and lower substrates according to the present invention, and FIG. 2 is a plan view of the liquid crystal display shown in FIG. 1.

As shown in the drawings, the lower substrate 1 is provided with a plurality of TFTs (referred to hereinafter as the "TFT array substrate"), and the upper substrate 4 with color filters (referred to hereinafter as the "color filter substrate"). Electrodes 2 and 5 are provided at the inner surfaces of the TFT array substrate 1 and the color filter substrate 4 facing each other to form electric fields. Alignment films 3 and 6 are formed on the electrodes 2 and 5, and rubbed in a predetermined direction. Liquid crystal molecules 7 are injected in-between the alignment layers 3 and 6. Polarizing plates 8 and 9 are attached to the external surfaces of the respective substrates 1 and 4 such that the polarizing axes thereof are perpendicular to each other.

As shown in FIG. 2, the size of the TFT array substrate 1 is larger than that of the color filter substrate 4. Pads are formed at the periphery of the TFT array substrate 1 to transmit external signals to the required lines, and exposed externally to the color filter substrate 4.

Figure 3:
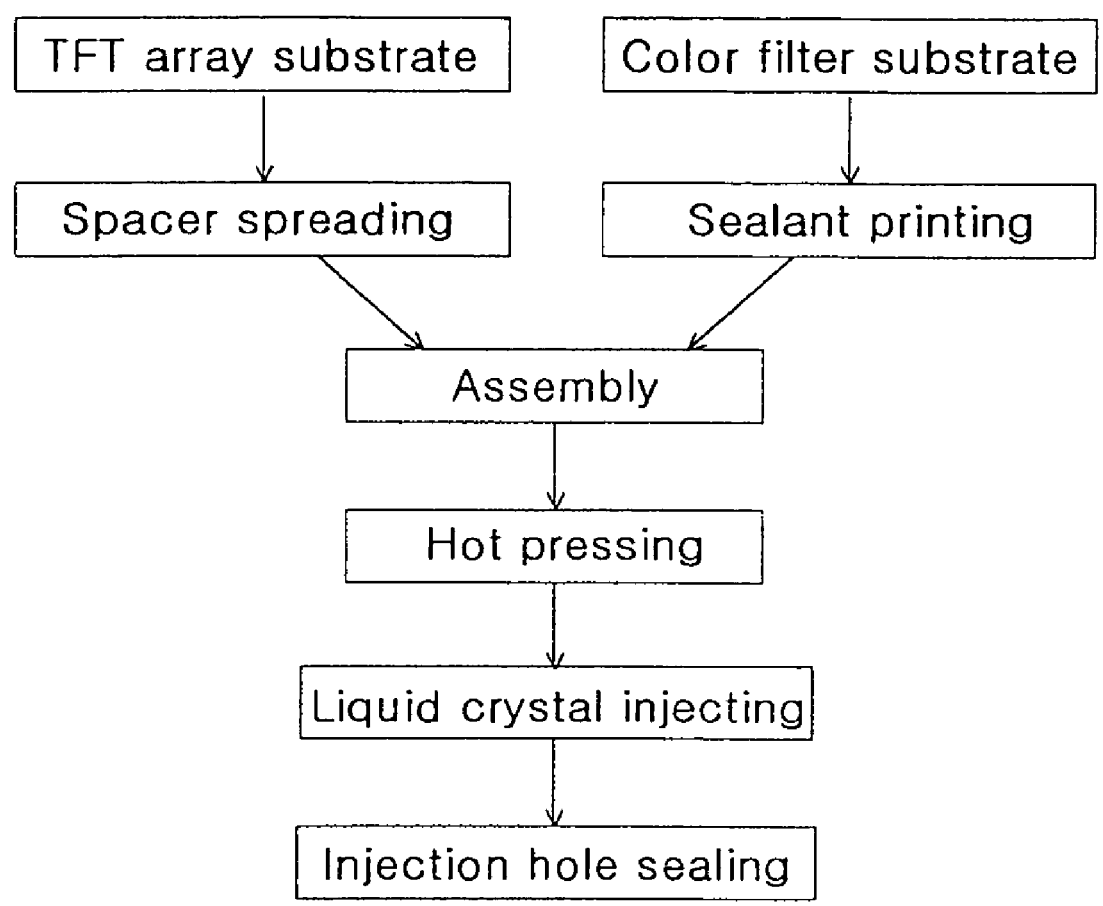
FIG. 3 is a flow diagram illustrating the steps of fabricating the liquid crystal display shown in FIG. 1.

FIG. 3 illustrates the steps of forming a liquid crystal cell in the process of fabricating the above-structured liquid crystal display.

A sealant of thermal hardening resin is printed onto one of the substrates, for example, onto the color filter substrate, to attach the color filter substrate to the TFT array substrate such that the substrates are spaced apart from each other with a predetermined distance. Thereafter, spacers of a predetermined size are spread onto the TFT array substrate to maintain the distance between the substrates in accurate and constant manners. The TFT array substrate and the color filter substrate are then assembled such that the pixel electrodes of the TFT substrate correspond to the color filters of the color filter substrate, and hot-pressed. Liquid crystal molecules are injected in-between the substrates through an injection hole, and the injection hole is sealed.

Figure 4:
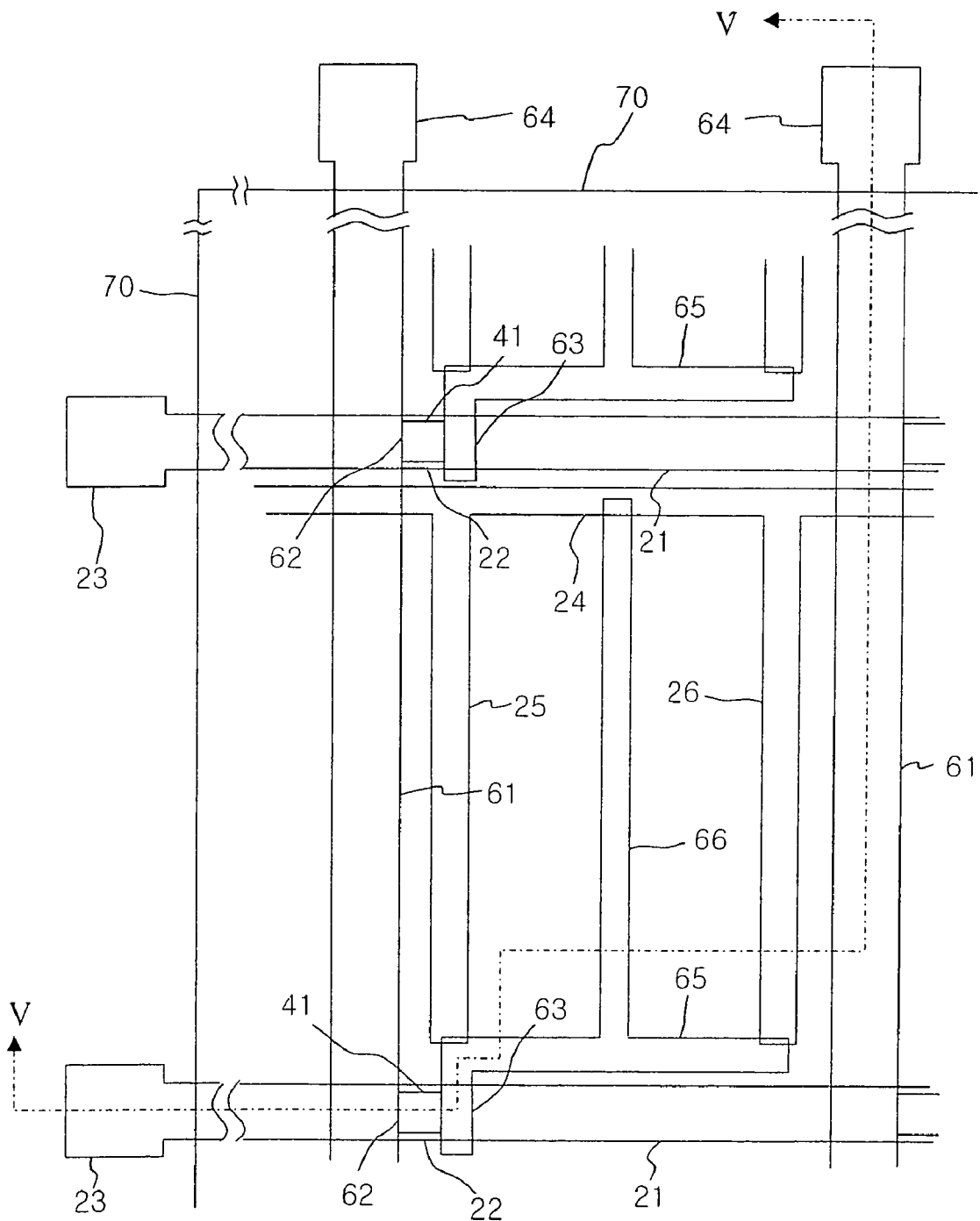
FIG. 4 is a plan view of a TFT array substrate for a liquid crystal display according to the first preferred embodiment of the present invention.

FIG. 4 is a plan view of a TFT array substrate for a liquid crystal display according to a first preferred embodiment of the present invention, and FIG. 5 is a cross sectional view of the TFT array substrate taken along the V–V' line of FIG. 4.

As shown in the drawings, a gate line assembly and a common electrode line assembly are formed on an insulating substrate 10 with a metallic or conductive material such as Al or Al alloy, Mo or MoW alloy, Cr, and Ta. The gate line assembly includes scanning signal lines or gate lines 21 proceeding in the horizontal direction, and gate pads 23 connected to the ends of the gate lines 21 to receive scanning signals from the outside and transmit them to the gate lines 21. Parts of the gate lines 21 functions as gate electrodes 22. The common electrode line assembly includes common signal lines 24, and common electrodes 25 and 26. Each common signal line 24 is interposed between the neighboring gate lines 21 such that it is positioned close to the front gate line 21 while proceeding parallel thereto. The common electrodes 25 and 26 are branched from the common signal line 24 while proceeding perpendicular thereto. Alternatively, the gate line assembly may be formed with a double or triple-layered structure. In this case, it is preferable that one layer is formed with a low resistance material, and the other layer with a material bearing good contact characteristics with other materials.

A gate insulating layer 30 is formed on the gate line assembly and the common electrode line assembly with silicon nitride (SiNx).

A semiconductor pattern 41 is formed on the gate insulating layer 30 with hydrogenated amorphous silicon. Ohmic contact patterns 51 and 52 are formed on the semiconductor pattern 41 with amorphous silicon doped by n type impurities such as phosphorous (P) in high concentration.

A data line assembly and a pixel electrode line assembly are formed on the ohmic contact patterns 51 and 52 with a conductive material such as Cr, Al and Al alloy. The data line assembly includes data lines 61 proceeding in the vertical direction to form pixel regions together with the gate lines 21, data pads 64 connected to the one-sided ends of the data lines 61 to receive picture signals from the outside, and source electrodes 62 being parts of the data lines 61, and drain electrodes 63 separated from the source electrodes 62. The pixel electrode line assembly includes pixel signal lines 65 connected to the drain electrodes 63 at the pixel regions while proceeding perpendicular thereto, and a pixel electrode 66 connected to each pixel signal line 65 such that it is positioned between the neighboring common electrodes 25 and 26 while proceeding parallel thereto. Alternatively, the data line assembly and the pixel electrode line assembly may be formed with a double or triple-layered structure as in the gate line assembly and the common electrode line assembly.

A passivation layer 70 is formed on the data line assembly and the pixel electrode line assembly. As shown in FIGS. 4 and 5, the passivation layer 70 at the pad portions is removed together with the gate insulating layer 30 such that the gate pads 23 and the data pads 64 are exposed to the outside. The gate insulating layer 30 and the passivation layer 70 over the gate pads 23 are all removed, but the gate insulating layer 30 under the data pads 64 remains. The passivation layer 70 may be formed with silicon nitride or acryl-based organic insulting material.

A method for fabricating the TFT array substrate will be now explained with reference to FIGS. 6A to 10.

Figure 6A:
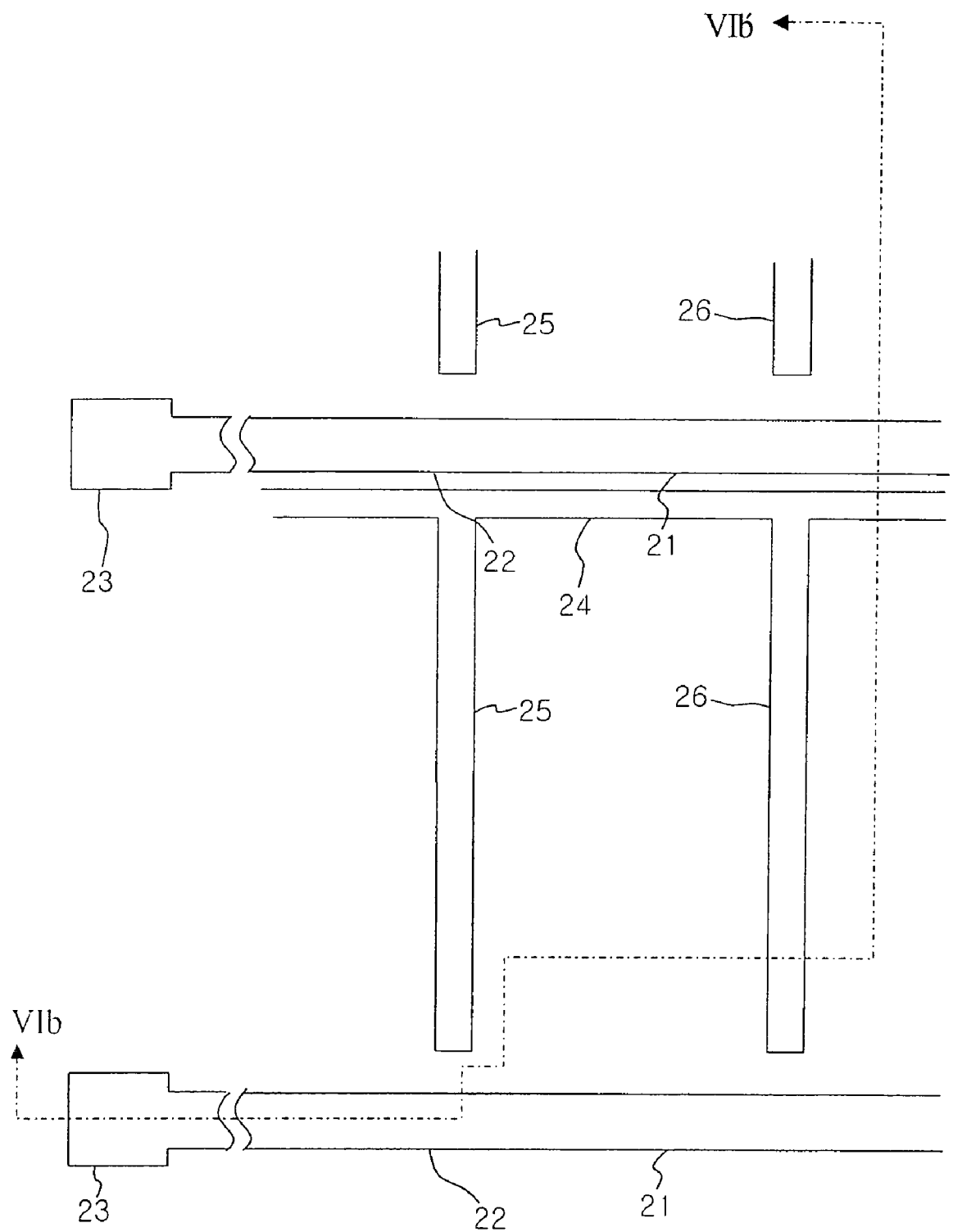
FIG. 6A is another plan view of the TFT array substrate shown in FIG. 4.

As shown in FIGS. 6A and 6B, a conductive layer with a thickness of 1000–3000 Å is deposited onto a substrate 10 through sputtering, and patterned to form a gate line assembly and a common electrode line assembly. The gate line assembly includes gate lines 21, and gate pads 23. The data line assembly includes common signal lines 24 proceeding parallel to the gate lines 21, and common electrodes 25 and 26 connected to the common signal lines 24. Parts of the gate lines 21 functions as gate electrodes 22.

Figure 7A:
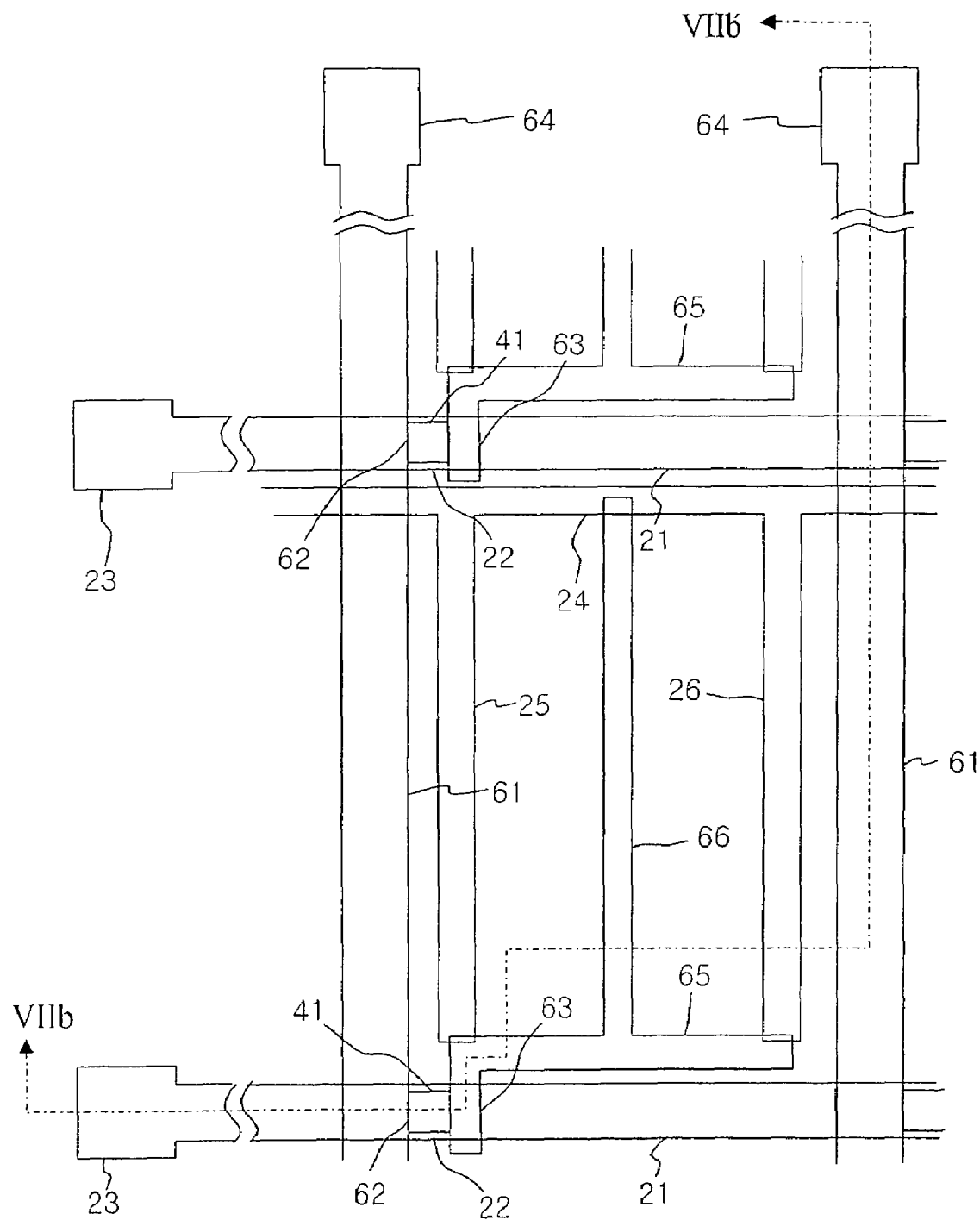
FIG. 7A is still another plan view of the TFT array substrate shown in FIG. 4.

Thereafter, as shown in FIGS. 7A and 7B, a gate insulating layer 30 with a thickness of 1500–5000 Å, a semiconductor layer 40 with a thickness of 500–2000 Å and an ohmic contact layer 50 with a thickness of 300–600 Å are sequentially deposited onto the substrate 10 through chemical vapor deposition (CVD), and a metallic conductive layer 60 with a thickness of 1500–3000 Å is deposited onto the ohmic through sputtering. A photoresist film with first and second portions 91 and 92 differentiated in thickness is then formed on the conductive layer 60.

The first and second photoresist portions 91 and 92 have different thickness depending on the positions. This can be achieved by either a mask with films bearing different light transmissions, or a mask with a slit or mosaic pattern.

In the former case, the mask has a transparent substrate, a thin film formed on the substrate with a light transmission of 3% or less corresponding to the area of a data line assembly and a pixel electrode line assembly, and a thin film with a light transmission of 20–50% corresponding to the TFT channel area. The first portion 91 of the photoresist film corresponding to the area of a data line assembly and a pixel electrode line assembly is the thickest. The second portion 92 of the photoresist film corresponding to the TFT channel area is thinner than the first portion 91. And the remaining portion of the photoresist film is entirely removed.

In the latter case, the mask has a transparent substrate, and a slit or mosaic pattern formed on the substrate corresponding to the TFT channel area. The opening width of the slit or mosaic pattern is established to be 2μm or less, which is smaller than the resolution of a light exposing device.

Thereafter, the photoresist film, and the underlying layers are etched. In this etching process, the data line assembly, the pixel electrode line assembly and the underlying layers are left out at the area A, a semiconductor pattern 41 is left out at the channel area C, and the gate insulating layer 30 is exposed at the remaining area B where the conductive layer 60, the ohmic contact layer 50 and the semiconductor layer 40 are removed.

Figure 8:
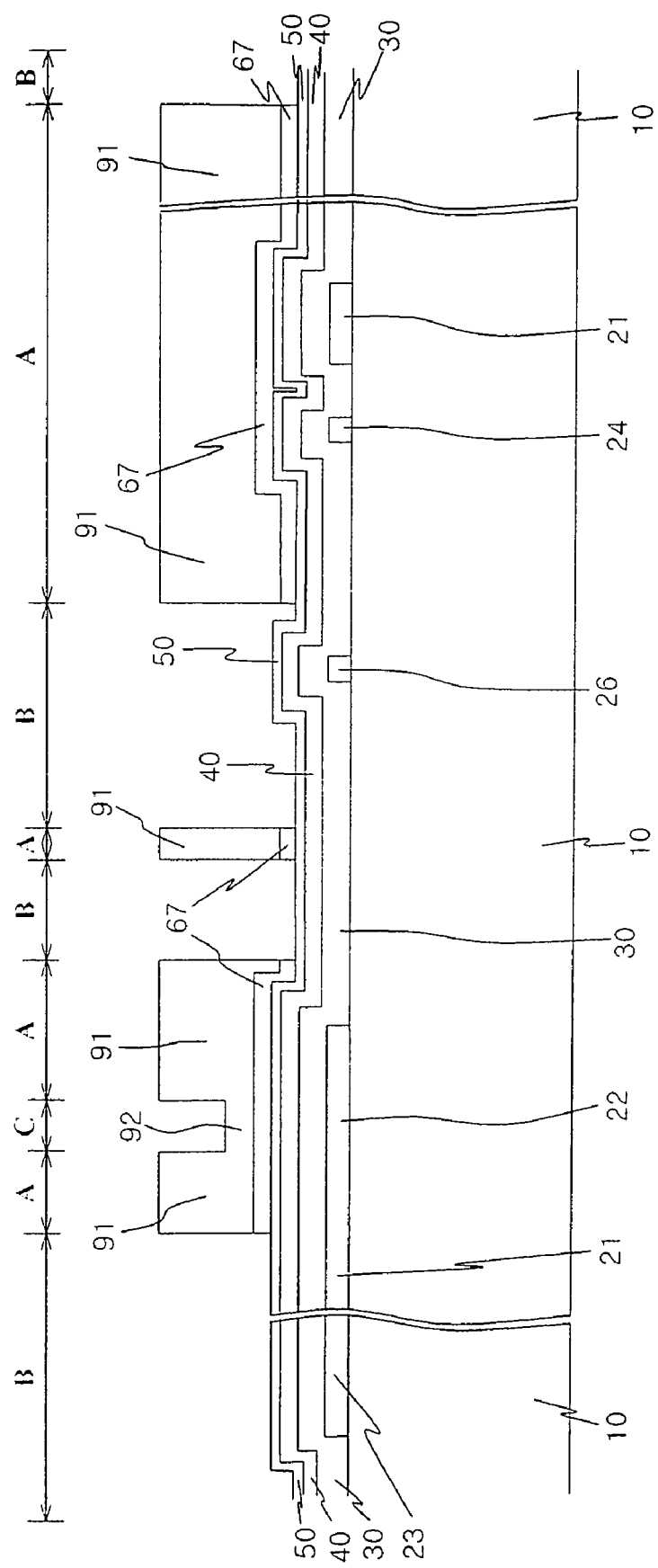

First, as shown in FIG. 8, the conductive layer 60 at the B area is removed through etching such that the underlying ohmic contact layer 50 is exposed. In this process, the conductive layer 60 is etched by either dry etching or wet etching but the photoresist film 91 and 92 need to be hardly etched. However, the dry etching method may etch the photoresist film 91 and 92 together with the conductive layer 60 because it is difficult to find a suitable selective etching condition. In this case, the thickness of the second photoresist portion 92 should be set thick enough to prevent from being removed while exposing the underlying conductive layer 60.

Consequently, as shown in FIG. 8, the conductive layer 60 at the B area is removed while exposing the underlying ohmic contact layer 50, and a conductive pattern 67 is formed at the TFT channel area C, and at the area A for a data line assembly and a pixel electrode assembly. At this time, the conductive pattern 67 has the same shape as the data line assembly and the pixel electrode line assembly except that the source and the drain electrodes 62 and 63 are not yet separated from each other. In the case of dry etching, the photoresist film 91 and 92 is also etched by a predetermined thickness.

Figure 9:
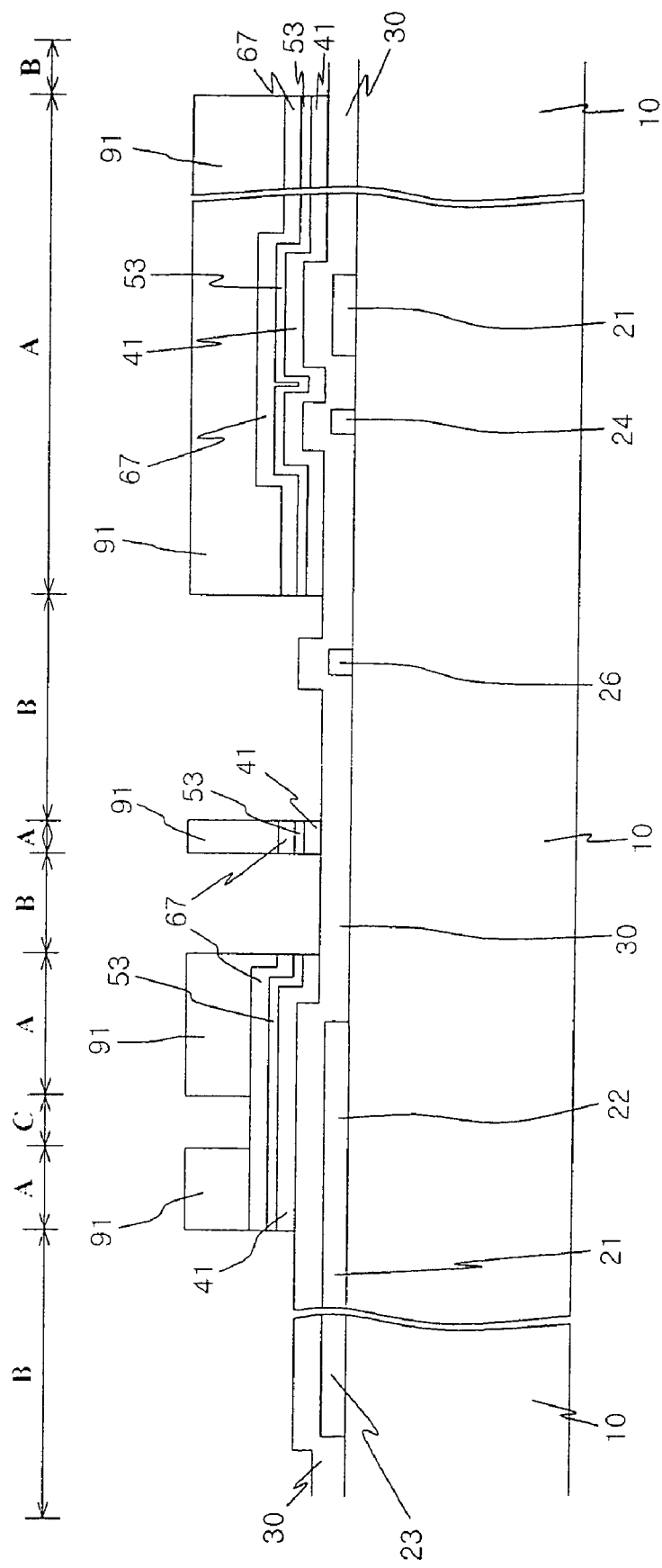

Thereafter, as shown in FIG. 9, the ohmic contact layer 50 at the B area and the underlying semiconductor layer 40 are simultaneously removed through dry etching together with the second photoresist portion 92. The etching is performed in a condition that the photoresist film 91 and 92, the ohmic contact layer 50 and the semiconductor layer 40 (the semiconductor layer and the ohmic contact layer bearing little etching selectivity) are simultaneously etched, but the gate insulating layer 30 is not etched. Particularly, it is preferable that the etching with respect to the photoresist film 91 and 92 and the semiconductor layer 40 should be performed under nearly the same etching conditions. When etching ratios with respect to the photoresist film 91 and 92 and the semiconductor layer 40 are the same, the thickness of the second photoresist portion 92 should be set the same as the sum of the thickness of the semiconductor layer 40 and the ohmic contact layer 50.

Consequently, as shown in FIG. 9, the second photoresist portion 92 at the channel area C is removed while exposing the conductive pattern 67, and the ohmic contact layer 50 and the semiconductor layer 40 at the B area are removed while exposing the underlying gate insulating layer 30. Meanwhile, the first photoresist portion 91 at the A area is also etched such that the thickness thereof becomes to be thinner. In this step, a semiconductor pattern 41 is completed. Reference numeral 53 indicates the ohmic contact pattern under the conductive pattern 67.

The photoresist residue on the conductive pattern 67 at the channel area C is removed by ashing. Plasma gas containing oxygen gas as the main component or microwave may be used for the ashing.

Figure 10:
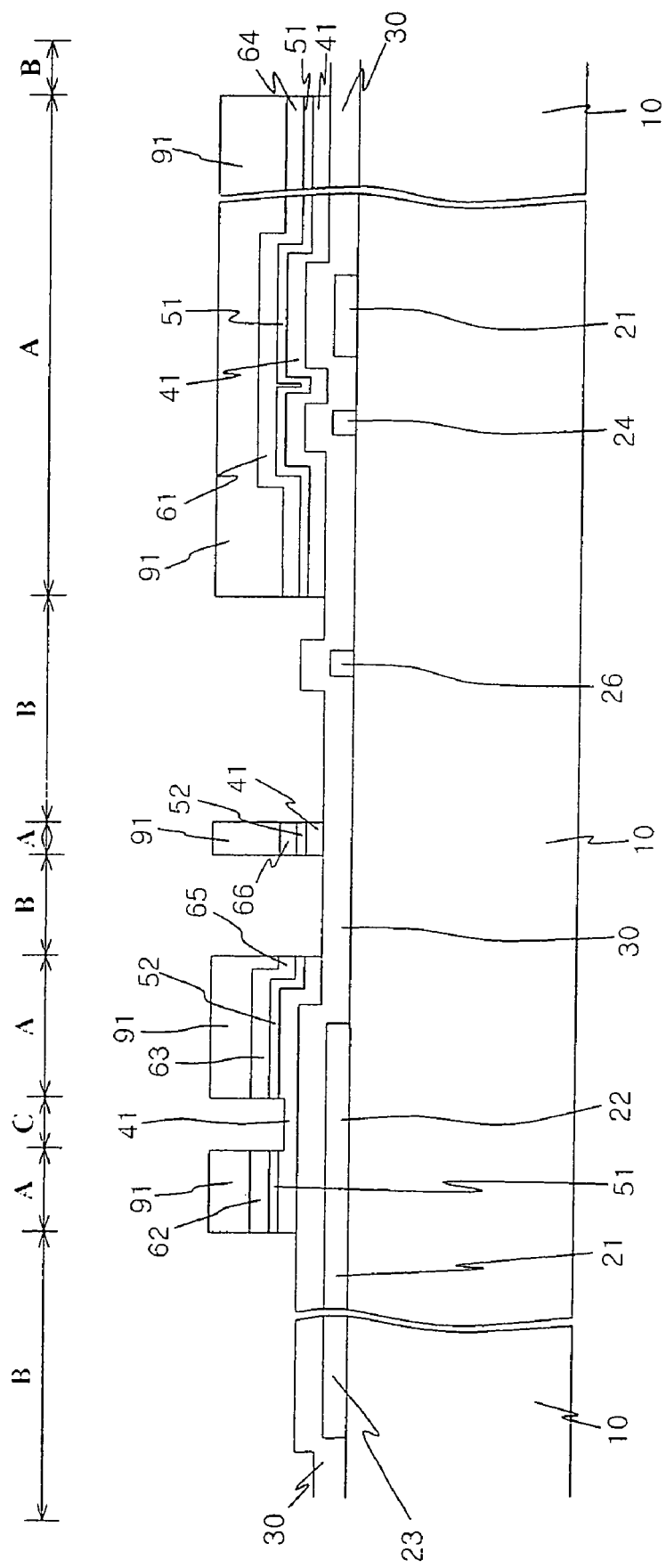

As shown in FIG. 10, the conductive pattern 67 at the channel area C and the underlying ohmic contact pattern 53 is etched out. Both of the conductive pattern 67 and the ohmic contact pattern 53 may be removed by dry etching, or only the ohmic contact pattern 53 is removed by dry etching and the conductive pattern 67 is removed by wet etching. At this time, the semiconductor pattern 41 may be partially removed and may become thinner. The first photoresist portion 91 is also etched by a predetermined thickness. The etching should be performed not to etch the gate insulating layer 30. The first photoresist portion 91 is preferably thick enough to prevent the underlying data line assembly and pixel electrode line assembly from being exposed through etching.

Consequently, the source and drain electrodes 62 and 63 are separated from each other while completing a data line assembly and ohmic contact patterns 51 and 52.

Finally, the first photoresist portion 91 at the area A is removed. Alternatively, the first photoresist portion 91 may be removed after the conductive pattern 67 at the channel area C is removed, but the underlying ohmic contact pattern 57 is not yet removed.

Furthermore, if the data line assembly is formed of a material well adapted for the dry etching, the ohmic contact patterns 51 and 52, the semiconductor pattern 41, the data line assembly and the pixel electrode line assembly may be completed at only one etching process by controlling the thickness of the photoresist film. That is, when the conductive layer 60, the ohmic contact layer 50 and the semiconductor layer 40 at the B area are etched, the second photoresist pattern 92 and the underlying ohmic contact layer 50 at the C area are etched, and the first photoresist pattern at the A area is partially etched.

In this way, the data line assembly and the pixel electrode line assembly are formed. Thereafter, as shown in FIGS. 4 and 5, silicon nitride is deposited onto the substrate 10 through CVD, or an organic insulating material is spin-coated onto the substrate 10 to thereby form a passivation layer 70 with a thickness of 2000 Å or more. The passivation layer 70 is etched together with the gate insulating layer 30 such that the gate pads 23 and the data pads 64 are exposed to the outside. As shown in FIG. 2, the exposed portion of the TFT array substrate may be removed through dry etching after the assembly process, or after the process of sealing the liquid crystal injection hole. Tape automated bonding (TAB) ICs are attached to the pad portions completely exposed through removing the passivation layer 70 or the gate insulating layer 30. At this time, it is preferable that a sealant is coated onto the pad area exposed through the ICs to prevent possible device failure due to the environmental factors.

As described above, in this preferred embodiment, the data line assembly, the pixel electrode line assembly, the ohmic contact pattern and the semiconductor layer are formed through only one photolithography process, and the process of exposing the pad portions is made after the assembly process or the process of sealing the liquid crystal injection hole. This results in simplified processing steps.

Figure 11:
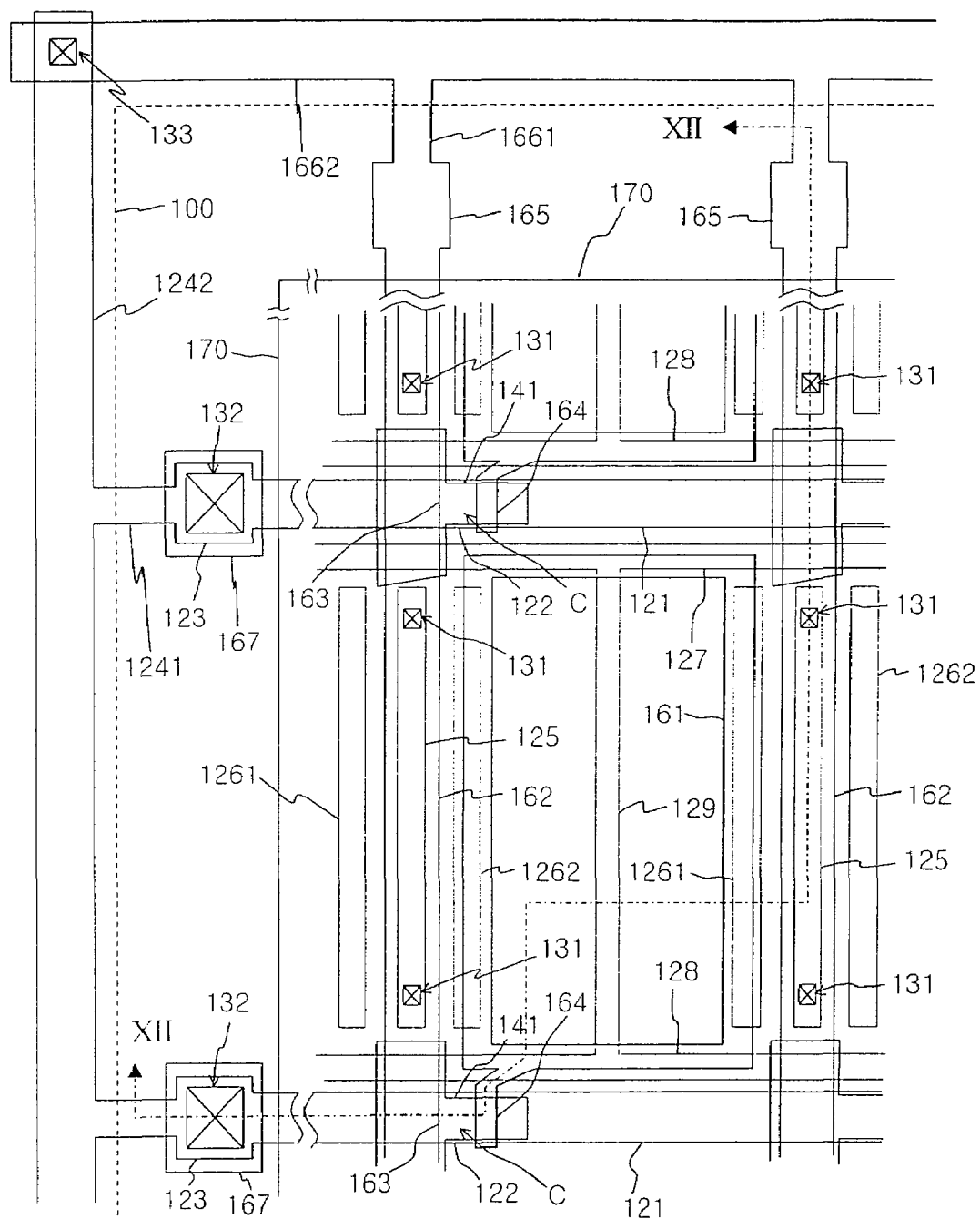
FIG. 11 is a plan view of a TFT array substrate according to the second preferred embodiment of the present invention.
Figure 12:
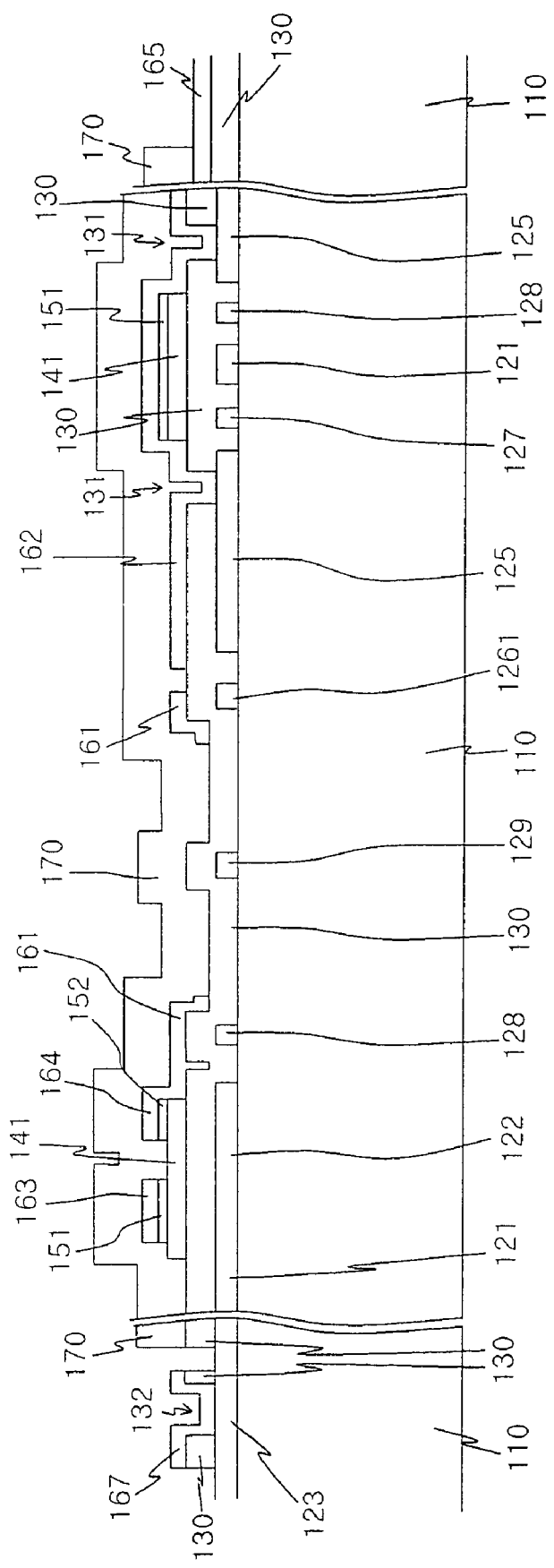
FIG. 12 is a cross sectional view of the TFT array substrate taken along the XII–XII' line of FIG. 11.

FIGS. 11 and 12 illustrate the structure of a TFT array substrate for a liquid crystal display according to a second preferred embodiment of the present invention.

As shown in the drawings, a gate line assembly, subsidiary data lines 125, first and second light interception patterns 1261 and 1262, and a common electrode line assembly are formed on an insulating substrate 110 with a metallic or conductive material such as Al or Al alloy, Mo or MoW alloy, Cr, and Ta. The gate line assembly includes scanning signal lines or gate lines 121 proceeding in the horizontal direction, gate pads 123 connected to the end portions of the gate lines 121 to receive scanning signals from the outside and transmit them to the gate lines 121, and a gate short circuit line 1242 connected to the gate pads 123 via connectors 1241 while proceeding in the vertical direction. Parts of the gate lines 121 functions as gate electrodes 122. Each subsidiary data line 125 is separately disposed between the neighboring gate lines 121 while proceeding perpendicular thereto. The first and second light interception patterns 1261 and 1262 are placed at both sides of the subsidiary data line 125 while proceeding parallel thereto. The common electrode line assembly includes upper and lower common signal lines 127 and 128, and common electrodes 129. The upper and lower common signal lines 127 and 128 are disposed between the neighboring gate lines 121 while each being positioned close to the relevant gate line 121 and proceeding parallel thereto. Each common electrode 129 interconnects the upper and lower common signal lines 127 and 128 in the vertical direction while being centrally positioned between the neighboring subsidiary data lines 125. The gate short circuit line 1242 interconnecting all of the gate lines 121 disperses static electricity occurring at the process.

The gate line assembly, the subsidiary data lines 125, the light interception patterns 1261 and 1262, and the common electrode line assembly may be formed with a double or triple-layered structure. In this case, it is preferable that one layer is formed with a low resistance material, and the other layer with a material bearing good contact characteristics with other materials.

A silicon nitride-based gate insulating layer 130 is formed on the gate line assembly, the subsidiary data lines 125, the light interception patterns 1261 and 1262, and the common electrode line assembly while covering the latter. The gate insulating layer 130 is provided with first to third contact holes 131, 132 and 133 exposing the subsidiary data lines 125, the gate pads 123 and the gate short circuit line 1242, respectively.

A semiconductor pattern 141 is formed on the gate insulating layer 130 with hydrogenated amorphous silicon. Ohmic contact patterns 151 and 152 are formed on the semiconductor pattern 141 with amorphous silicon doped with n type impurities such as phosphorous (P).

A data line assembly, pixel electrodes 161, and subsidiary gate pads 167 are formed on the ohmic contact patterns 151 and 152 with a conductive material such as Mo or MoW alloy, Cr, Al or Al alloy, and Ta. The data line assembly includes data lines 162 proceeding in the vertical direction, source electrodes 163 positioned over the gate lines 121 as parts of the data lines 162, drain electrodes 164 positioned opposite to the source electrodes 163 with respect to the TFT channels, data pads 165 connected to the one sided ends of the data lines 162 to receive picture signals from the outside, and a data short circuit line 1662 connected to the data pads 165 via connectors 1661 while proceeding in the horizontal direction. The data short circuit line 1662 for preventing device failure due to discharge of static electricity is connected to the gate short circuit line 1242 via a contact hole 133. Therefore, even though static electricity is generated either to the gate line assembly or to the data line assembly, such a static electricity can be dispersed throughout all of the relevant lines. The short circuit lines 1242 and 1662 are later removed through cutting the substrate along the dotted line 100 shown in FIG. 11. The pixel electrodes 161 are overlapped with the upper and lower common signal lines 127 and 128, and the first and second light interception patterns 1261 and 1262 at their peripheral portions. The central portion of each pixel electrode 161 is removed such that it has a ring shape. Alternatively, the pixel electrode 161 may not be overlapped with the first and second light interception patterns 1261 and 1262. In this case, the distance between the pixel electrode 161 and the first and second light interception patterns 1261 and 1262 is established to be 2 μm or less.

A passivation layer 170 is formed on the data line assembly, the pixel electrodes 161, and the subsidiary gate pads 167. The passivation layer 170 at the pad portions and the short circuit line portions are removed together with the gate insulating layer 130 such that the gate pads 123, the gate connectors 1241, the gate short circuit line 1242, the data pads 165, the data connectors 1661 and the data short circuit line 1662 are all exposed to the outside. At this time, the gate insulating layer 130 and the passivation layer 170 over the gate pads 123, the gate connectors 1241 and the gate short circuit line 1242 are all removed, but the gate insulating layer 130 under the data pads 165, the data connectors 1661 and the data short circuit line 1662 are not removed. The passivation layer 170 is formed with silicon nitride or acryl-based organic insulating material.

A method for fabricating the above-structured TFT array substrate will be explained with reference to FIGS. 13A to 18B.

Figure 13A:
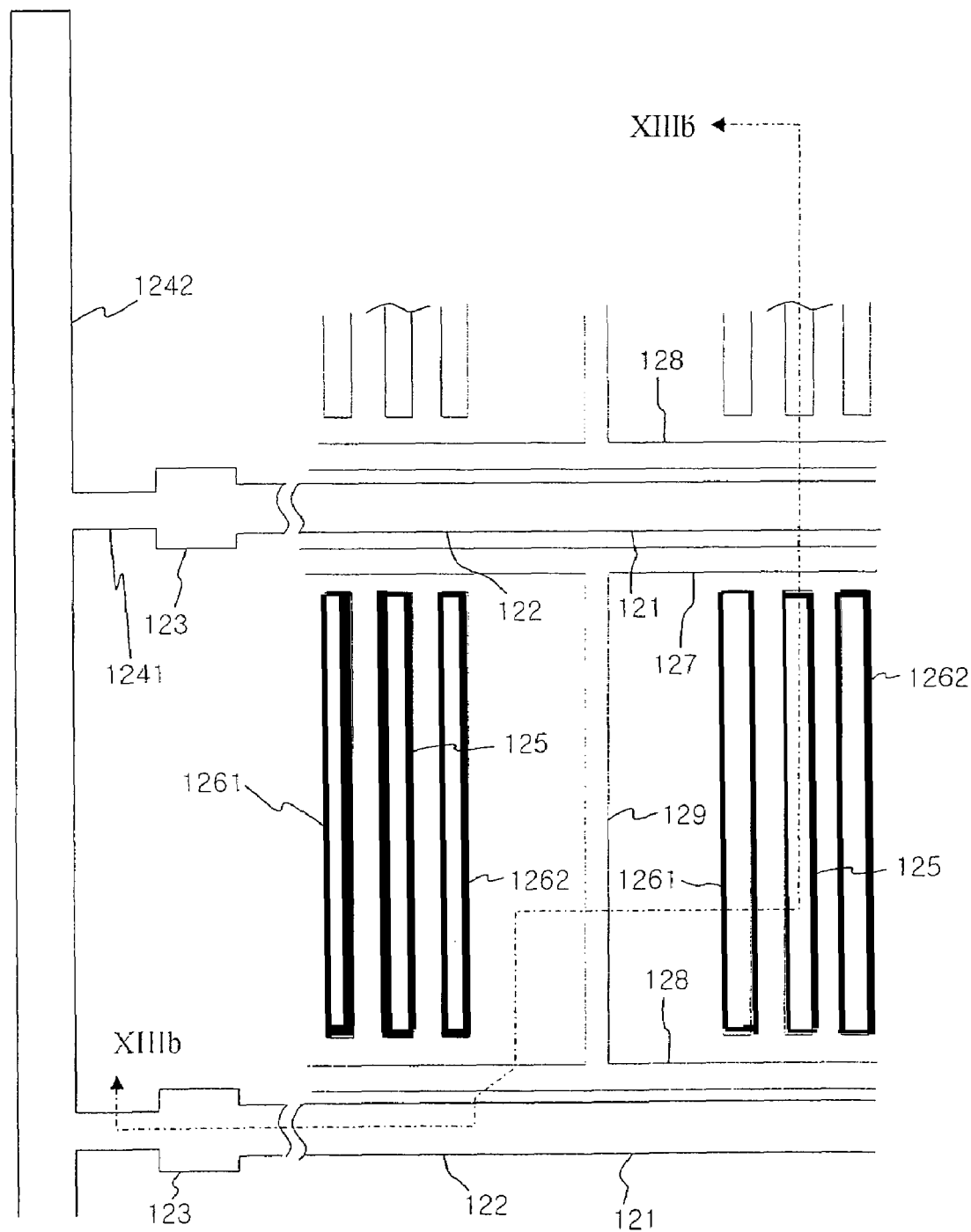
FIG. 13A is another plan view of the TFT array substrate shown in FIG. 11.
Figure 13B:
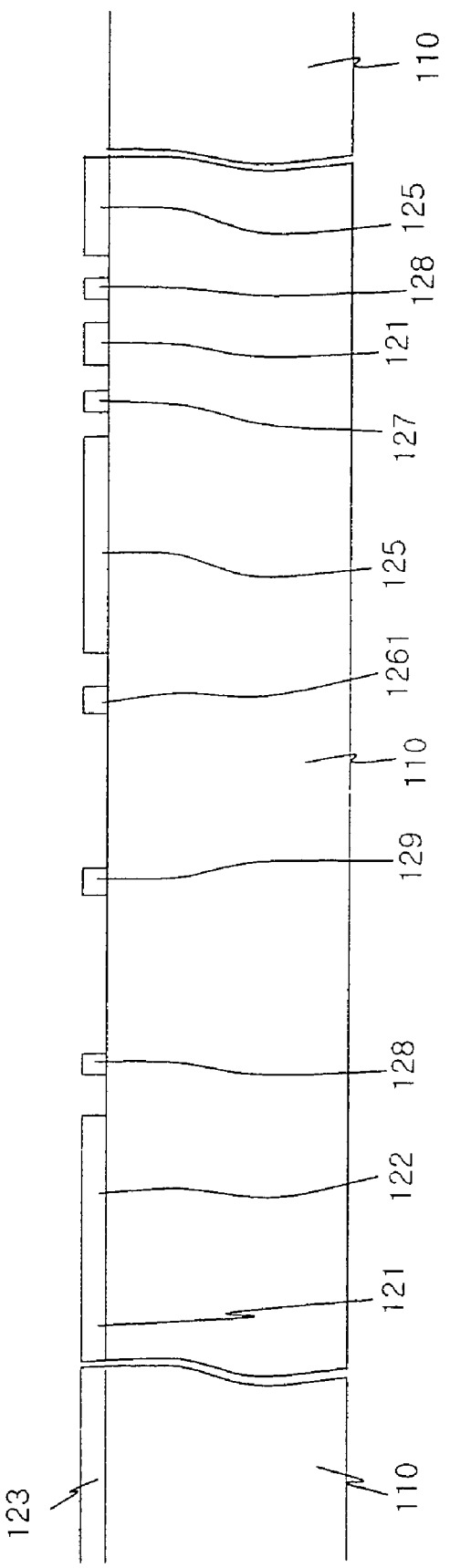
FIG. 13B is a cross sectional view of the TFT array substrate taken along the XIIIb–XIIIb' line of FIG. 13A.

As shown in FIGS. 13A and 13B, a metallic conductive layer with a thickness of 1000 to 3000 Å is deposited onto a substrate 110 through sputtering, and patterned to thereby form a gate line assembly, a common electrode line assembly, subsidiary data lines 125, and first and second light interception patterns 1261 and 1262. The gate line assembly includes gate lines 121, gate pads 123, and a gate short circuit line 1242 connected to the gate pads 123 via connectors 1241. Parts of the gate lines 121 functions as gate electrodes 122. The common electrode line assembly includes upper and lower common signal lines 127 and 128 disposed between the neighboring gate lines 121, and common electrodes 129 connected to the upper and lower common signal lines 127 and 128.

Thereafter, as shown in FIGS. 14A to 17, an ohmic contact pattern 153, a semiconductor pattern 141, and contact holes 131, 132 and 133 are formed.

Figure 14A:
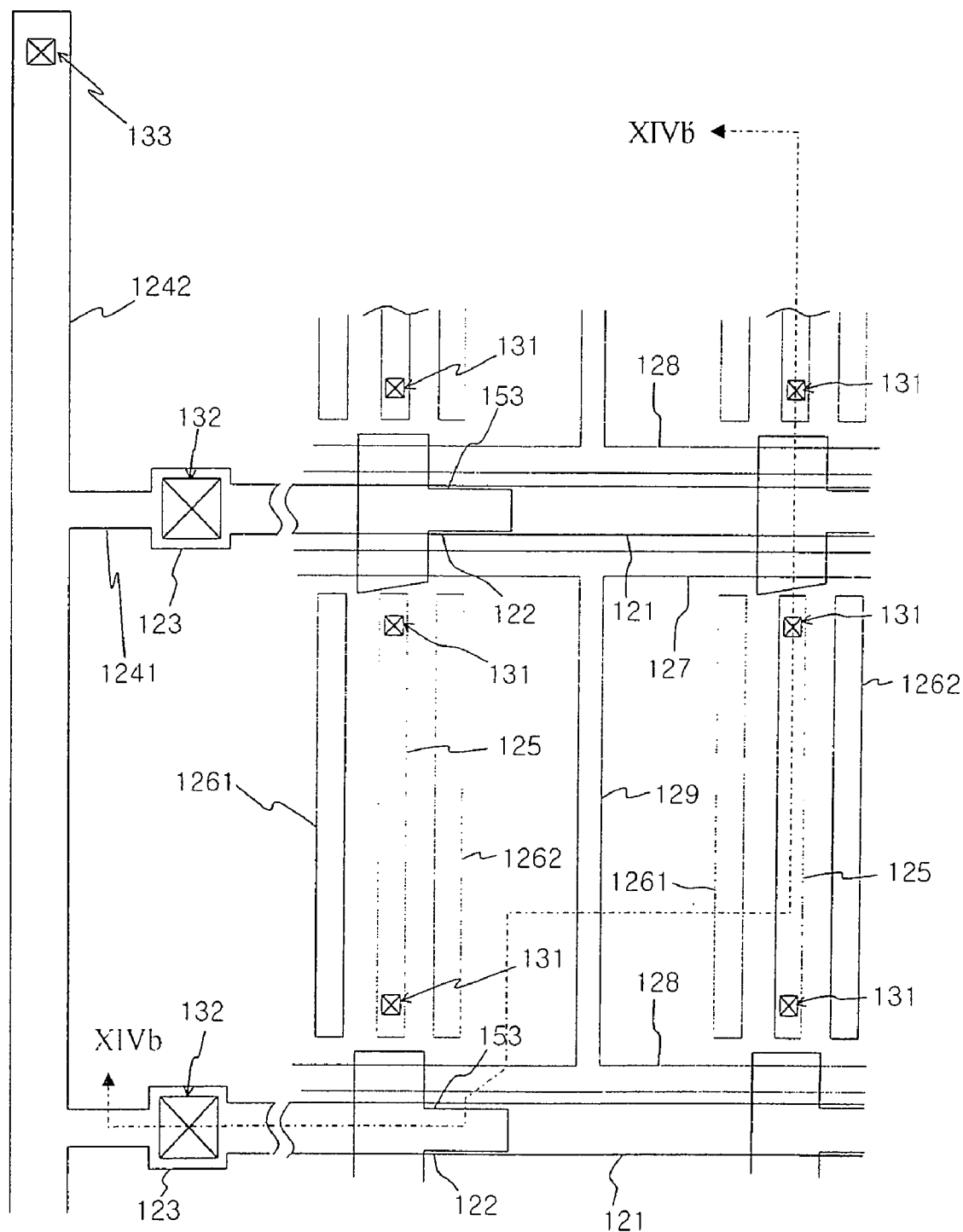
FIG. 14A is still another plan view of the TFT array substrate shown in FIG. 11.
Figure 14B:
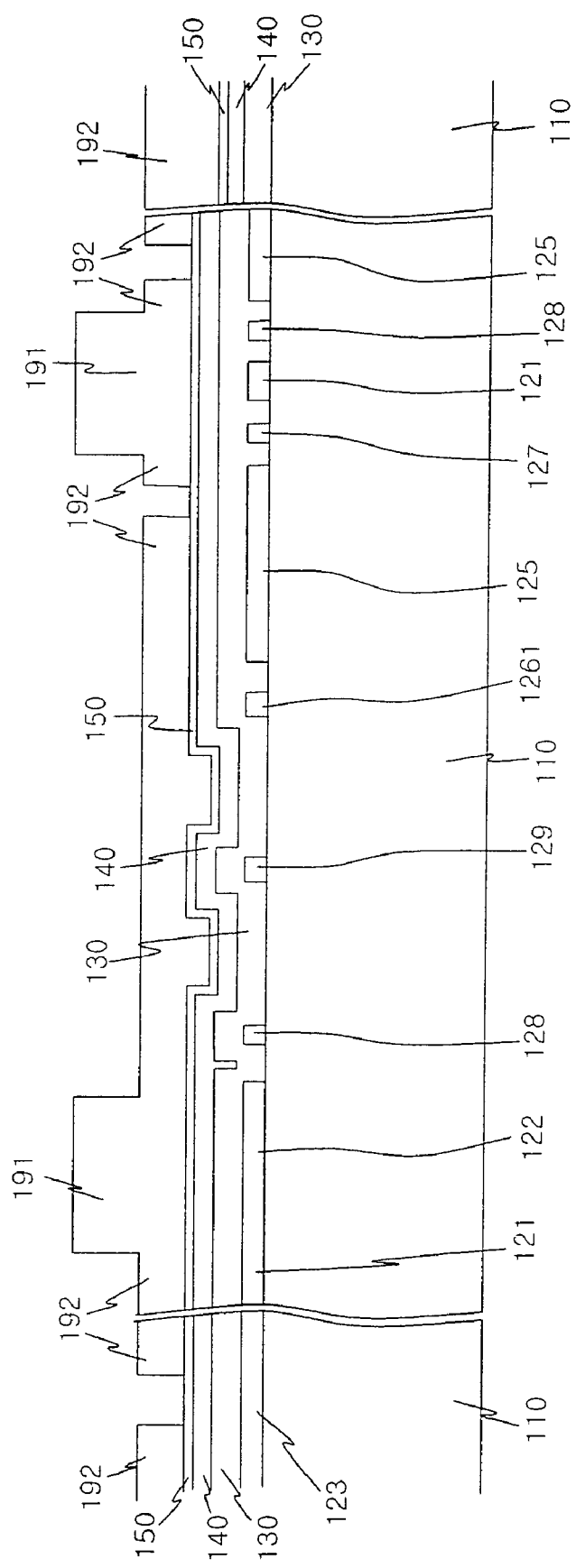

First, as shown in FIGS. 14A and 14B, a gate insulating layer 130 with a thickness of 1500 to 5000 Å, a semiconductor layer 140 with a thickness of 500 to 2000 Å and an ohmic contact layer 150 with a thickness of 300 to 600 Å are sequentially deposited onto the substrate 110 through CVD. A photoresist film with third and fourth portions 191 and 192 in different thickness are then formed on the ohmic contact layer 150. As in the first preferred embodiment, using a mask with films different in light transmission, or a mask with a slit or mosaic pattern, the third photoresist portion 191 for forming an ohmic contact pattern 153 and a semiconductor pattern 141 is set to be the thickest. And the fourth photoresist pattern 192 is set to be thinner than the third photoresist pattern 191. The photoresist film placed over the area of contact holes 131, 132 and 133 is entirely removed.

Thereafter, the fourth photoresist portion 192 and the underlying ohmic contact layer 150, semiconductor layer 140 and gate insulating layer 130 are etched. At this time, the ohmic contact layer 150 and the semiconductor layer 140 for forming an ohmic contact pattern 153 and a semiconductor pattern 141 are left out, and the ohmic contact layer 150, the semiconductor layer 140 and the gate insulating layer 130 for forming contact holes 131, 132 and 133 are removed while exposing the underlying gate pads 123, gate short circuit line 1242 and subsidiary data lines 125. The remaining ohmic contact layer 150 and semiconductor layer 140 are all removed while leaving out the gate insulating layer 130.

Figure 15:
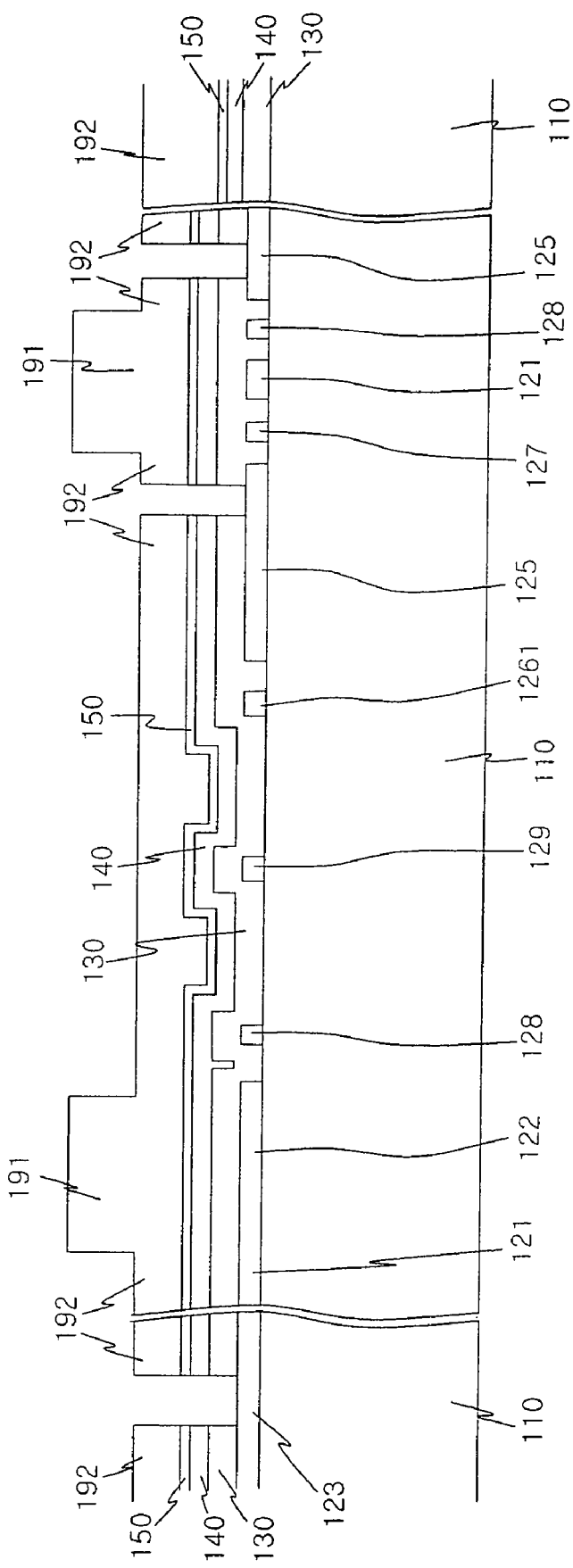

For this purpose, as shown in FIG. 15, the ohmic contact layer 150, the semiconductor layer 140 and the gate insulating layer 130 for forming the contact holes 131, 132 and 133 are removed through dry etching or wet etching.

Figure 16:
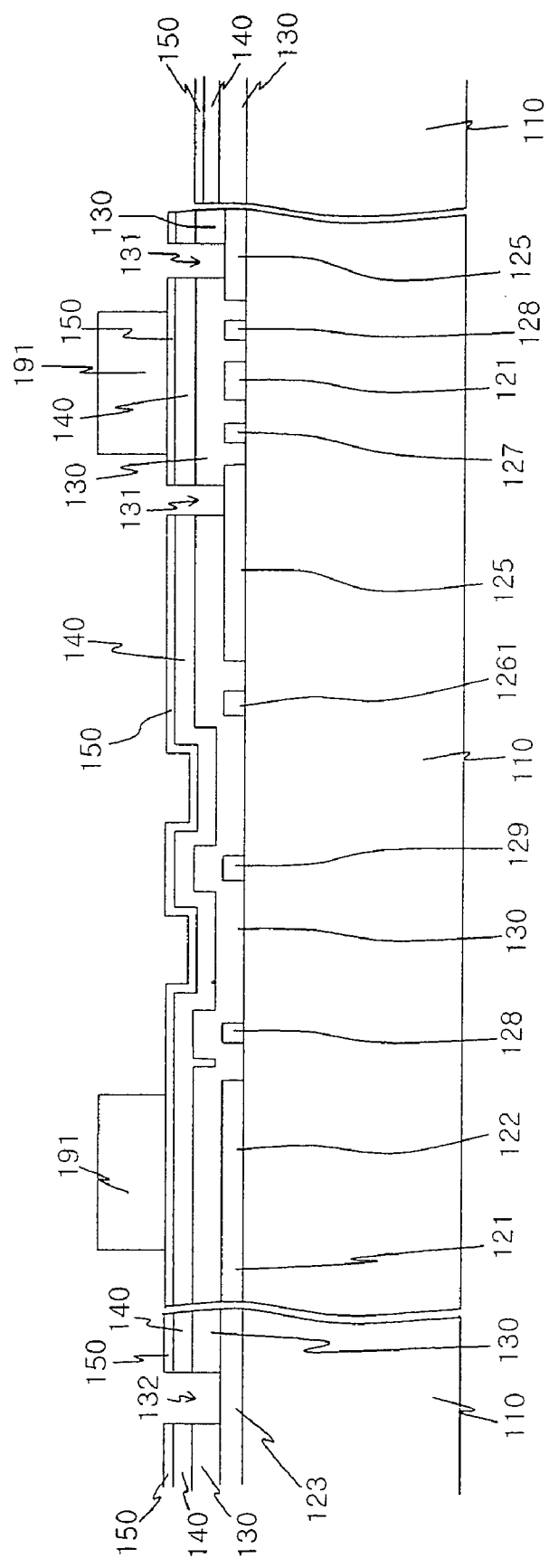

As shown in FIG. 16, the fourth photoresist portion 192 is removed through ashing while exposing the underlying ohmic contact layer 150. At this time, the third photoresist portion 191 is partially etched by a predetermined thickness.

Figure 17:
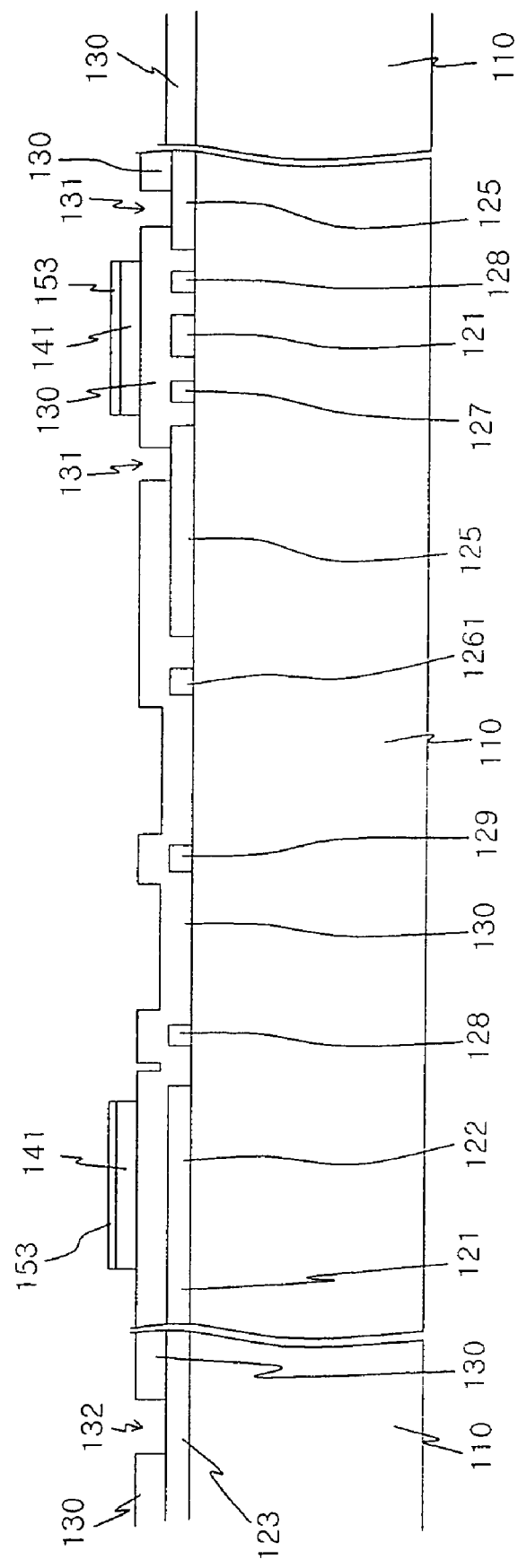

As shown in FIG. 17, the ohmic contact layer 150 and the semiconductor layer 140 are etched to form an ohmic contact pattern 153 and a semiconductor pattern 141, and the remaining third photoresist portion 191 is removed.

Figure 18A:
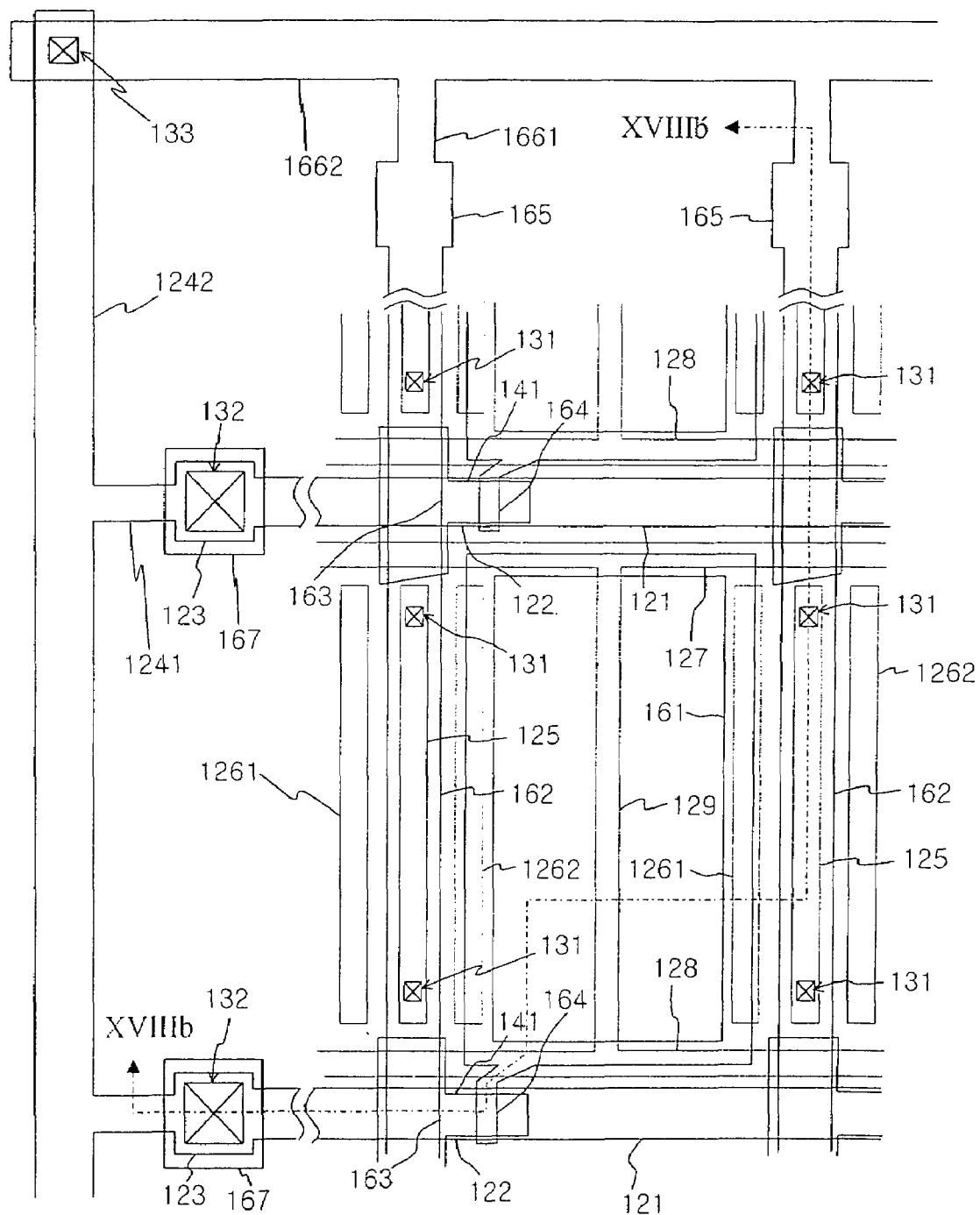
FIG. 18A is still another plan view of the TFT array substrate shown in FIG. 11.
Figure 18B:
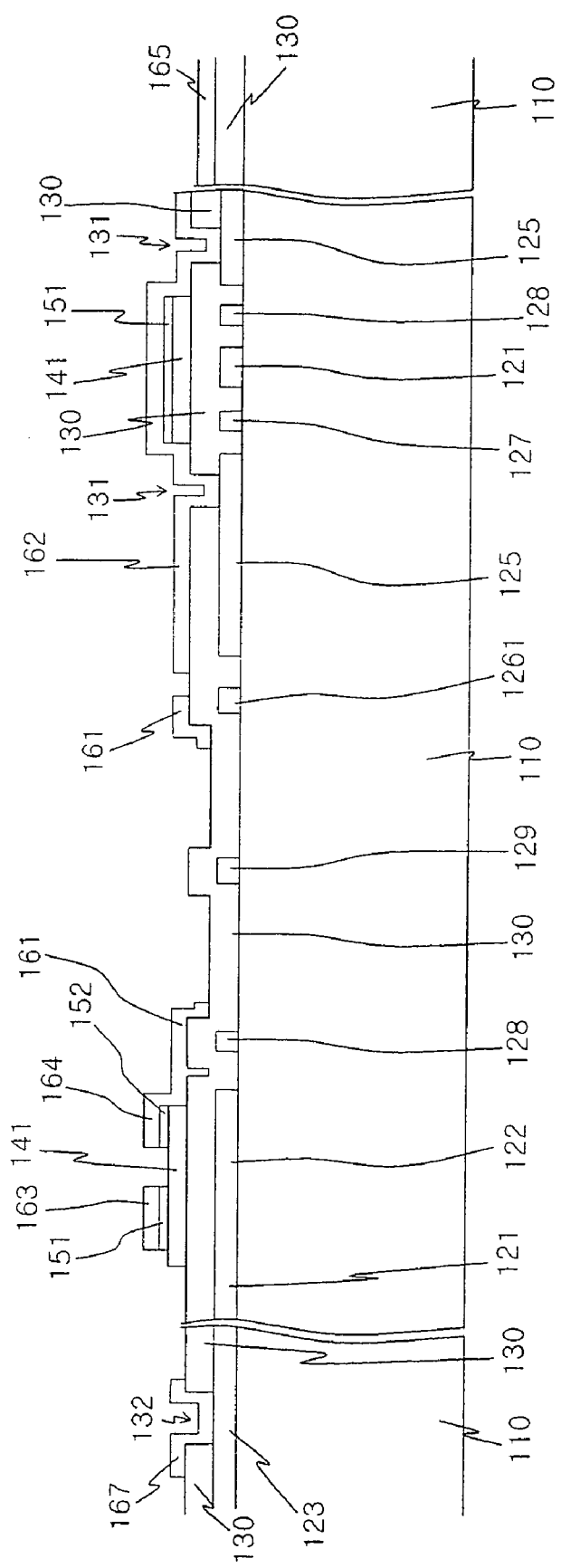
FIG. 18B is a cross sectional view of the TFT array substrate taken along the XVIIIb–XVIIIb' line of FIG. 18A.

As shown in FIGS. 18A and 18B, a metallic conductive layer with a thickness of 1500 to 3000 Å is deposited onto the substrate 110 through sputtering, and patterned to thereby form pixel electrodes 161, a data line assembly, and subsidiary gate pads 167. The data line assembly includes data lines 162, drain electrodes 164, data pads 165, connectors 1661, and a data short circuit line 1662. Parts of the data lines 162 function as source electrodes 163. Then, the exposed ohmic contact pattern 153 is etched to thereby complete ohmic contact patterns 151 and 152. At this time, the pixel electrodes 161 are partially overlapped with the upper and lower common signal lines 127 and 128, and the first and second light interception patterns 1261 and 1262. Each pixel electrode 161 has its center removed such that it has a ring shape. Alternatively, the pixel electrode 161 may be spaced apart from the first and second light interception patterns 1261 and 1262 with a distance of 2 μm or less. The subsidiary gate pads 167 are to strengthen adhesion of the gate pads 123 to external circuits while protecting them. Such subsidiary gate pads are not necessarily required, but may be selectively adopted.

Finally, as shown in FIGS. 11 and 12, silicon nitride is deposited onto the substrate 110 through CVD, or an organic insulating material is spin-coated onto the substrate 110 to thereby form a passivation layer 170 with a thickness of 2000 Å or more. Like the first preferred embodiment, the exposed passivation layer 170 and gate insulating layer 130 are etched after an assembly process or after sealing the liquid crystal injection hole such that the subsidiary gate pads 167, the data pads 165, the connectors 1241 and 1661 and the short circuit lines 1242 and 1662 are exposed to the outside.

In this preferred embodiment, contact holes are formed at the gate insulating layer during the step of forming the semiconductor pattern such that the gate line assembly and the data line assembly contact each other via the contact holes. Furthermore, the gate and data pads may be formed at the same plane as either the gate line assembly or the data line assembly with the same material, and connected to the relevant line assembly through contact holes.

On the other hand, a shadow frame may be used to simplify the processing steps. The shadow mask is used to prevent depositing the gate insulating layer or the semiconductor on the pad portions including the gate and the data pads to expose the pads.

Now, a structure of a TFT array substrate according to an embodiment of the present invention will be described with reference to the FIGS. 19 to 23.

Figure 19:
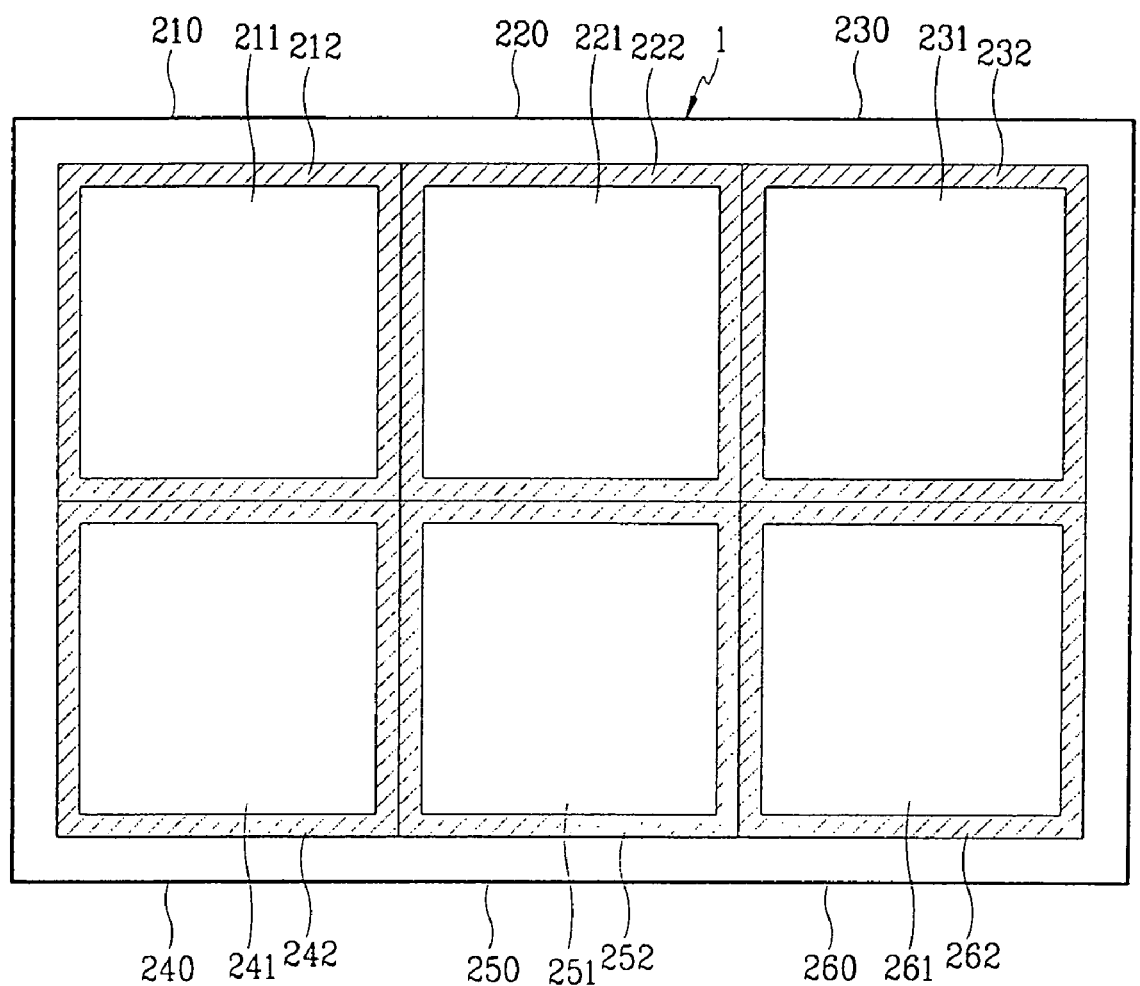
FIG. 19 is a plan view of a substrate partitioned to manufacture a TFT array substrate for an LCD according to an embodiment of the present invention.

As shown in FIG. 19, a plurality of panel areas is formed on an insulating plate 1. For example, as shown in FIG. 19, six panel areas 210, 220, 230, 240, 250 and 260 are formed on a glass plate 1. When the substrates are TFT array substrates, the substrate areas 210, 220, 230, 240, 250 and 260 include display areas 211, 221, 231, 241, 251 and 261 having a plurality of pixels and peripheral areas 212, 222, 232, 242, 252 and 262 respectively. TFTs, wires including gate lines and data lines, pixel electrodes, and common electrodes are repeatedly arranged in a matrix shape in the display areas 211, 221, 231, 241, 251 and 261. Pads to be connected to external circuits and electrostatic discharge protection circuits are provided in the peripheral areas 212, 222, 232, 242, 252 and 262.

Figure 20:
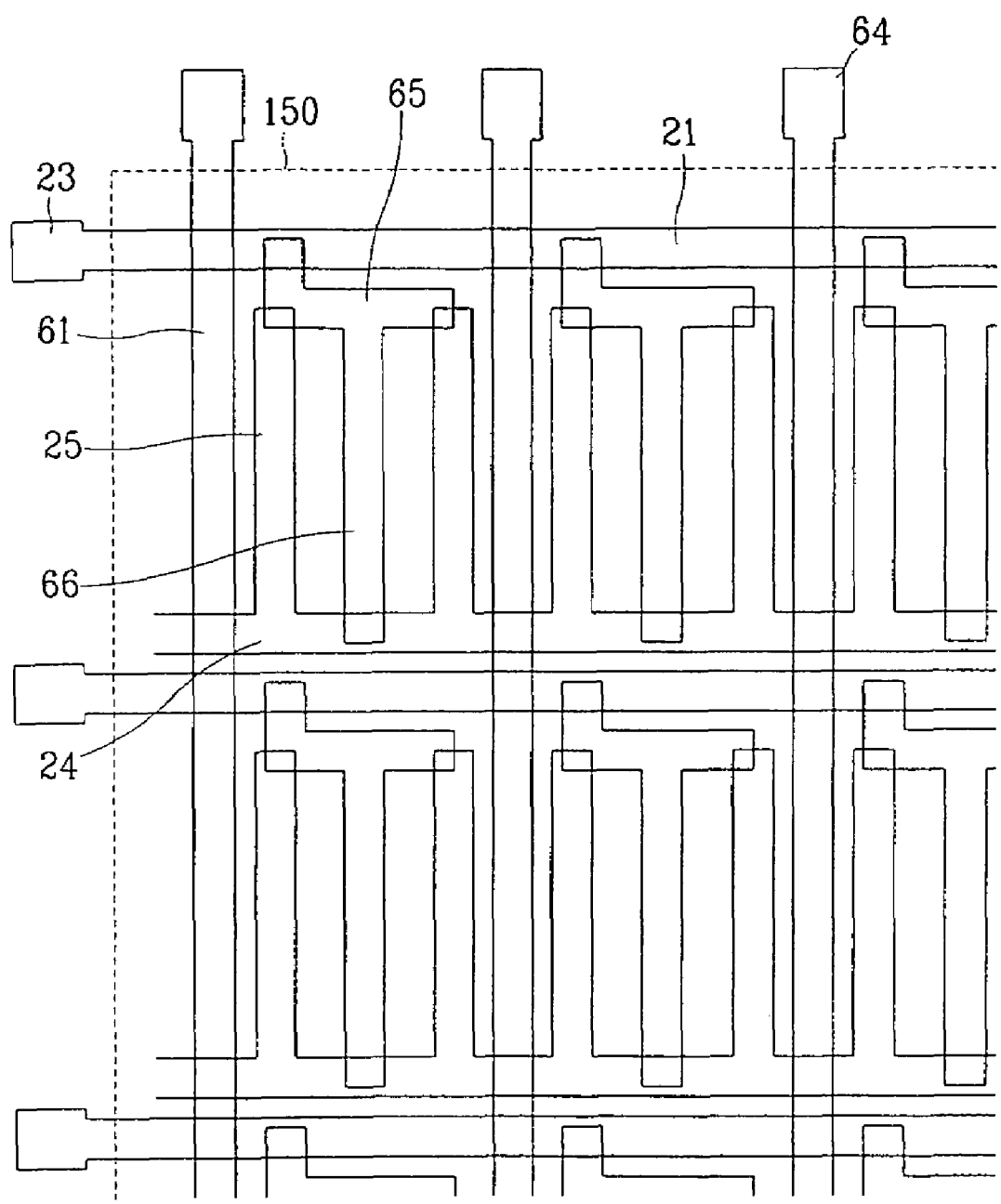
FIG. 20 is a layout view of a TFT array substrate for an LCD according to an embodiment of the present invention.

FIG. 20 is a layout view of one TFT array substrate area shown in FIG. 19 according to an embodiment of the present invention.

As shown in FIG. 20, a number of a plurality of wires including pixel electrode line assembly 65 and 66, gate lines 21, data lines 61, and common electrode line assembly 24 and 25 are formed in the display area surrounded by an imaginary line 150. Gate pads 23 and data pads 64 respectively connected to the gate lines 21 and the data lines 61 are formed in the peripheral area.

Figure 21:
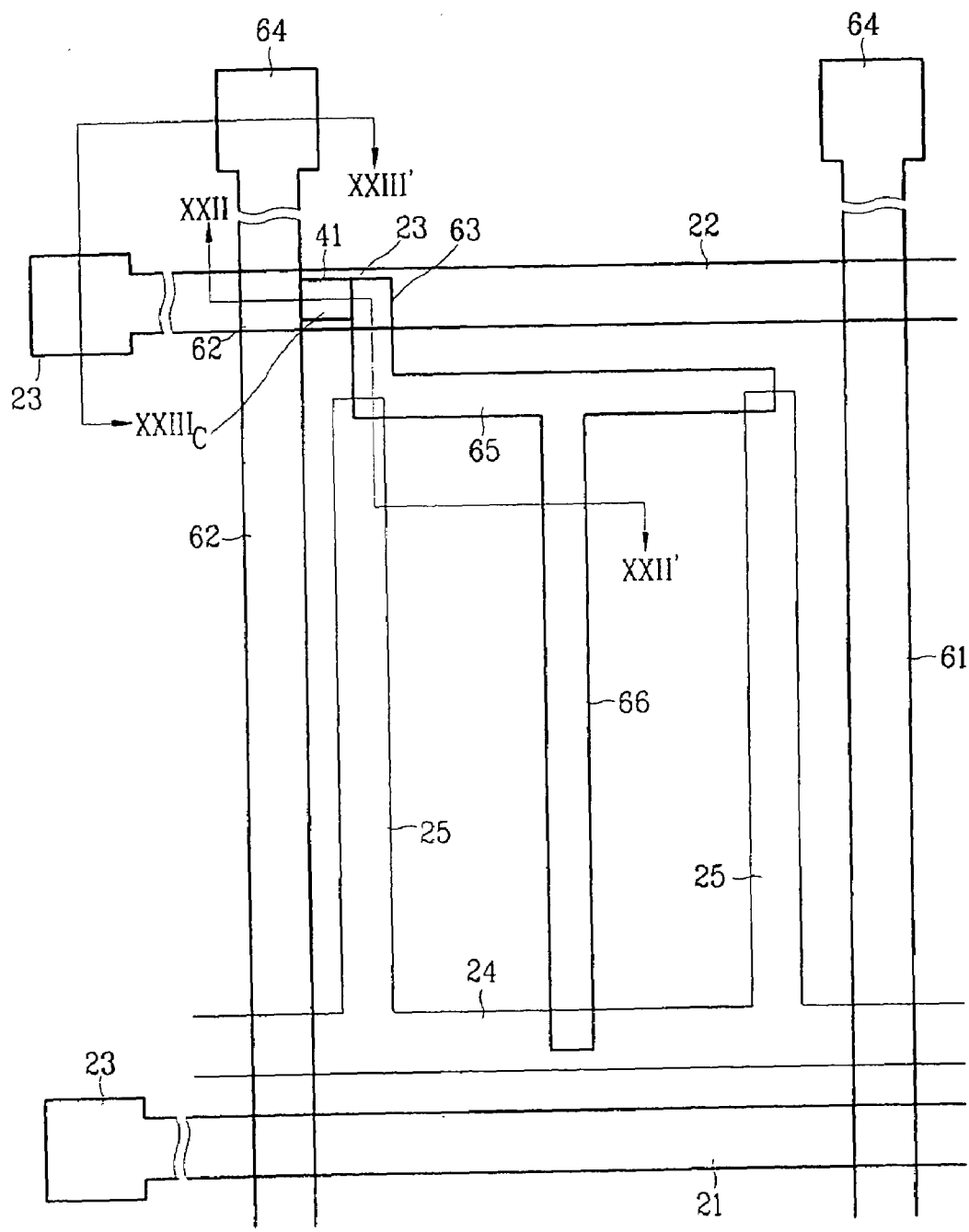
FIG. 21 is a layout view of a TFT array substrate for an LCD according to the third embodiment of the present invention, and an enlarged view of a portion mainly including a pixel and pads of the FIG. 20.
Figure 22:
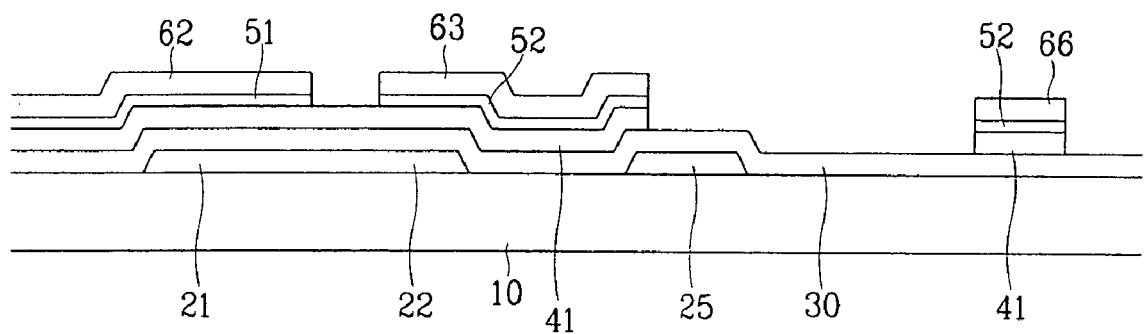
FIGS. 22 and 23 are cross-sectional views respectively taken along the line XXII–XXII' and XXIII–XXIII' of the FIG. 21.
Figure 23:
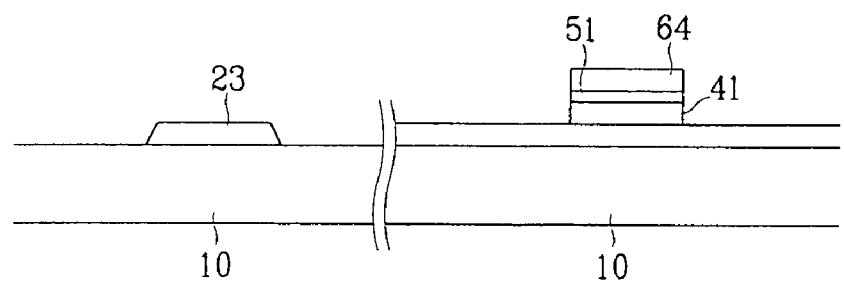

FIG. 21 is a layout view of a TFT panel for an LCD according to a third embodiment of the present invention, and an enlarged view of a portion mainly including a pixel and pads of the FIG. 20. FIGS. 22 and 23 are cross-sectional views respectively taken along the line XXII–XXII' and XXIII–XXIII' of the FIG. 21.

As shown in FIGS. 21 to 23, most of structure is the same as that of the first embodiment.

However, in this embodiment, the gate insulating layer 30 is removed in the peripheral areas, on which the gate pads 23 are formed, to expose the gate pads 23, and the passivation layer is not formed.

Here, the common electrode line assembly 24 and 25 provides storage capacitance along with the pixel electrode line assembly 65 and 66 by overlapping each other. The ohmic contact pattern 51 reduces the contact resistance between the semiconductor pattern 41 and the corresponding data line assembly parts 61, 62, 63 and 64, and has the same layout as the data line assembly parts 61, 62, 63 and 64, and the pixel electrode line assembly 65 and 66. In other word, a first ohmic contact portion 51 under the data line part has the same shape as the data line parts 61, 62, and 64, a second ohmic contact portion 52 under the drain electrode part has the same shape as the drain electrode 63, and the pixel electrode line assembly 65 and 66. Also, the semiconductor pattern 41 has the same layout as the corresponding data line assembly 61, 62, 63 and 64, and the pixel electrode line assembly 65 and 66, and the corresponding ohmic contact pattern 51, 52 except for the channel part C of the thin film transistor. In other words, the data line assembly 61, 62, and 63, especially the source electrode 62 and the drain electrode 63 are separated from each other by the channel part C of thin film transistor and the portions 51 and 52 of ohmic contact layer pattern thereunder are also separated from each other, but the semiconductor portion 41 is not divided into two pieces so that it can traverse the channel of a thin film transistor.

In this embodiment, the semiconductor pattern 41 or the ohmic contact patterns 51 and 52 may be extended outside the data line assembly 61, 62, 63 and 64, and the pixel electrode line assembly 65 and 66.

On the other hand, a passivation layer may be formed on the data line assembly 61, 62, 63 and 64, and the pixel electrode assembly 65 and 66. The passivation layer may have contact holes exposing the data pads 64, and the gate pad 23, and can be made of an insulating material such as SiNx, acrylic organic material, other transparent photo-definable material, or other organic material. Furthermore, a redundant data line assembly electrically connected to the data line assembly may be formed on the passivation layer.

A manufacturing method for a thin film transistor array panel according to the third embodiment of the present invention will now be described with reference to the FIGS. 24A to 35C and FIGS. 19 to 23.

Figure 24A:
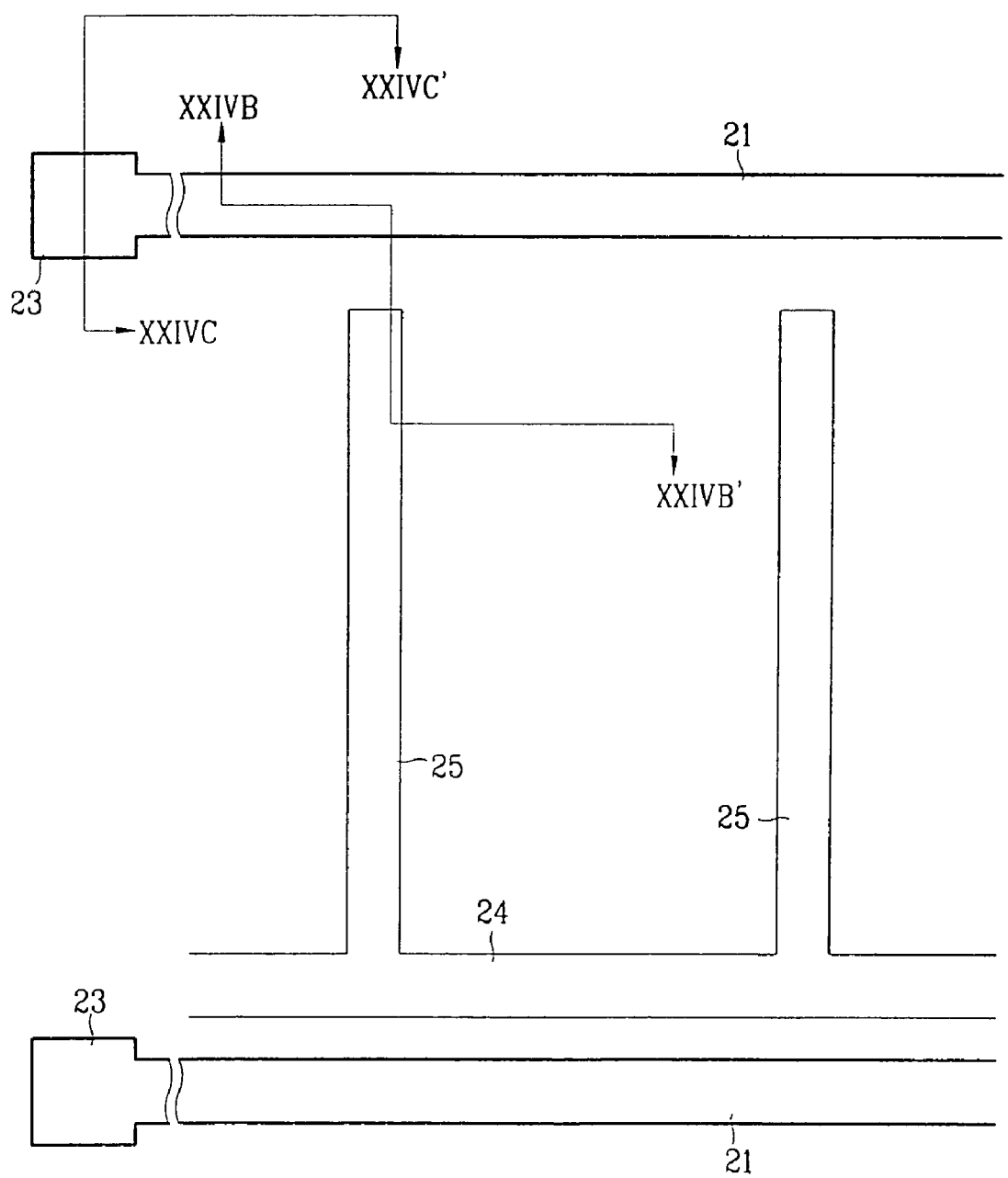
FIG. 24A is a layout view of a TFT array substrate in the first manufacturing step according to the third embodiment of the present invention.
Figure 24B:
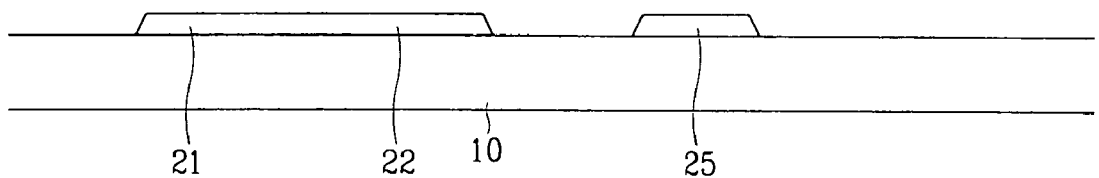
FIGS. 24B and 24C are respectively the cross-sectional views taken along the line XXIVB–XXIVB' and XXIVC–XXIVC' of the FIG. 24A.
Figure 24C:
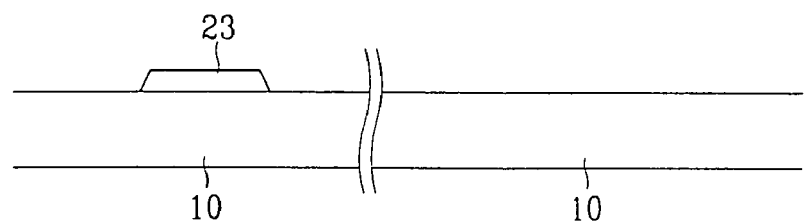

At first, as shown in FIGS. 24A to 24C, a layer of conductor, such as a metal, is deposited on a substrate 10 by such methods as sputtering to a thickness of 1,000 Å to 3,000 Å, and gate line assembly including a gate line 21, a gate pad 23, a gate electrode 22, and a common electrode line assembly including a common electrode line 24 and common electrodes 25 are formed by dry or wet etching using a first mask.

Figure 25A:
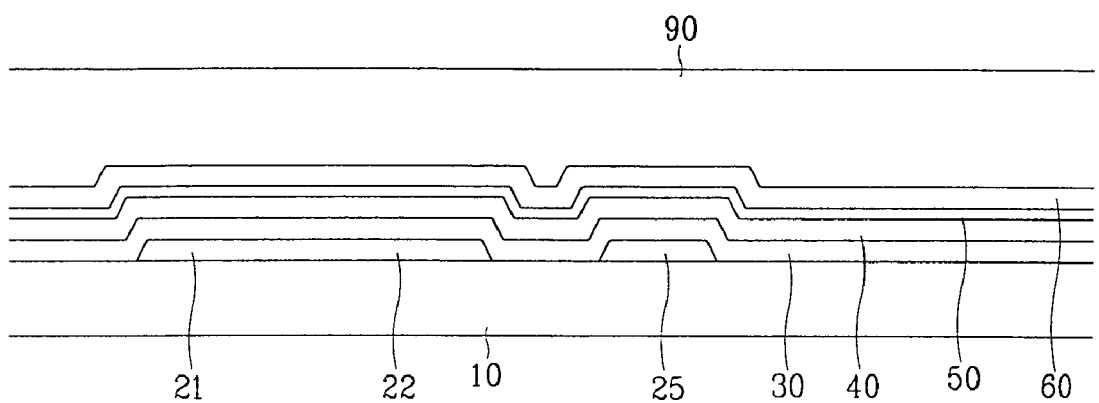
FIGS. 25A and 25B are the cross-sectional views respectively taken along the line XXIVB–XXIVB' and XXIVC–XXIVC' of the FIG. 24A in a manufacturing step following the FIGS. 24B and 24C.
Figure 25B:
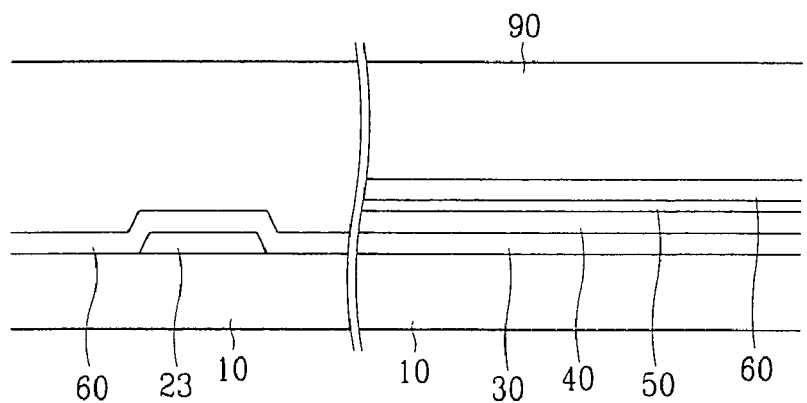
Figure 26:
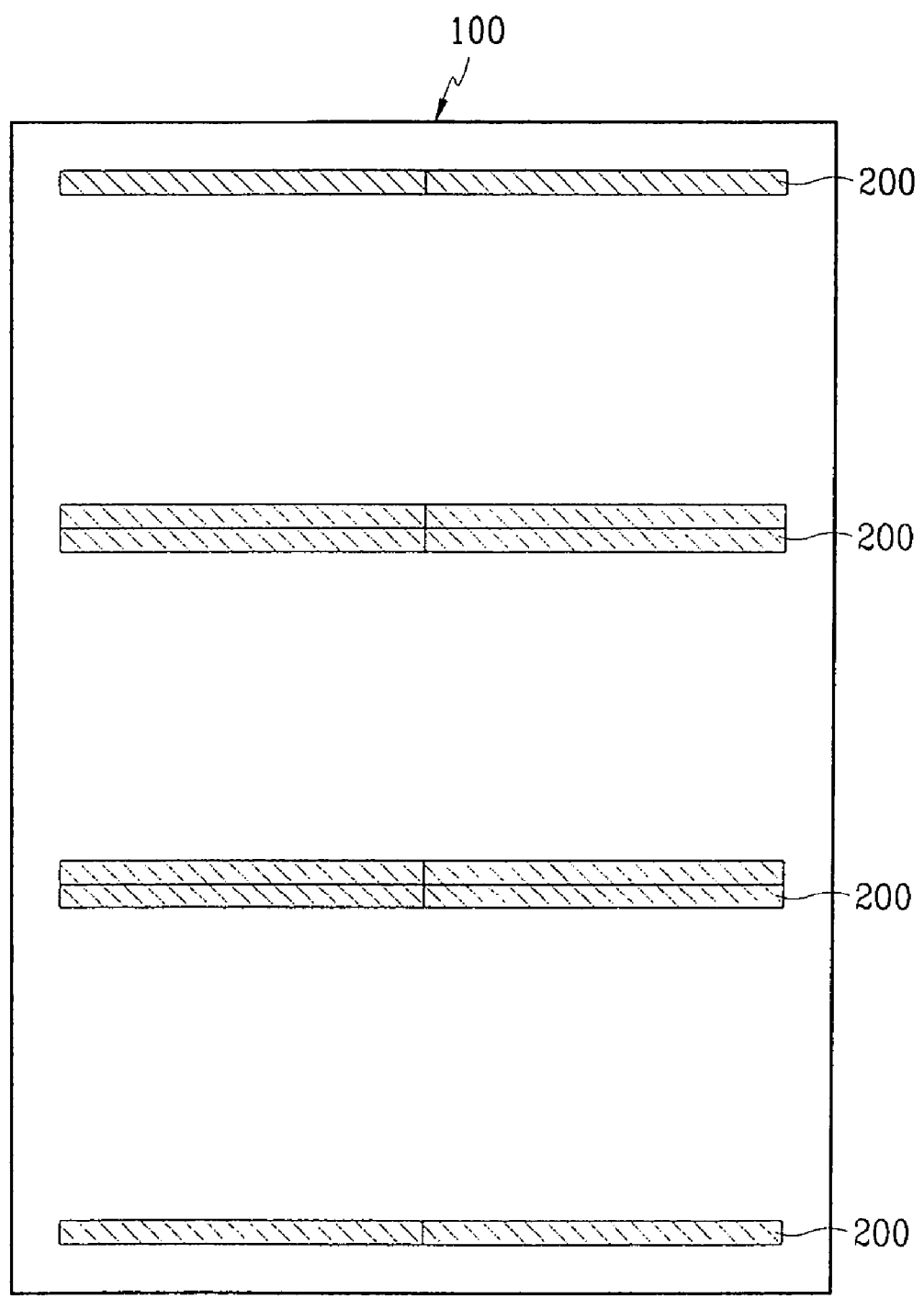
FIG. 26 is a plan view of a shadow frame used in a manufacturing of a TFT array substrate for an LCD according to an embodiment of the present invention.

Next, as shown in FIGS. 25A and 25B, a gate insulating layer 30, a semiconductor layer 40, and an ohmic contact layer 50 are sequentially deposited to thicknesses of 1,500 Å to 5,000 Å, 500 Å to 2,000 Å, and 300 Å to 600 Å, respectively, by such methods as chemical vapor deposition (CVD). Then, a conductor layer 60, such as a metal, is deposited to a thickness of 1,500 Å to 3,000 Å by such methods as sputtering and a photoresist layer 90 having a thickness of 1 μm to 2 μm is coated on the conductive layer 60. Here, the gate insulating 30 is only deposited on the portion except for the gate portion of the peripheral areas on which the gate pads 23 are formed, and the semiconductor layer 40, the ohmic contact layer 50 or the conductor layer 60 may be selectively deposited such as the gate insulating layer 30. For this deposition, a shadow frame having a deposition blocking area 200 on the portion corresponding to the gate portion of the peripheral areas is used, as shown in FIG. 26. The deposition blocking area 200 is a portion on which a blocking layer to prevent thin films from being deposited, as a lined portion in FIG. 26. Of course, a deposition blocking area may be extended on the portion corresponding to the whole peripheral areas including the data portion having data pads 64 that will be formed later, to prevent the gate insulating layer 30, the semiconductor layer 40, or the ohmic contact layer 50 from being selectively deposited.

Figure 27:
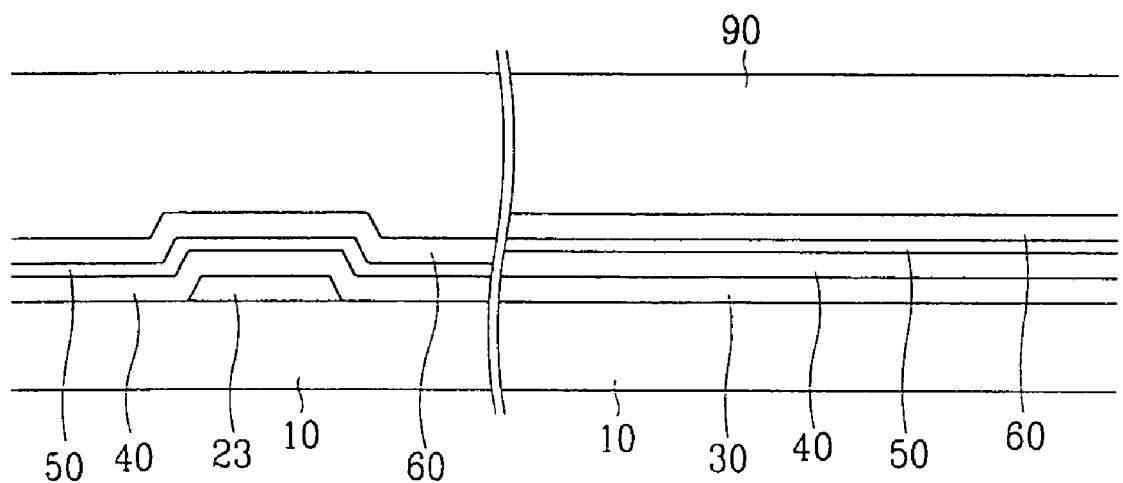
FIG. 27 is the cross-sectional view taken along the line XXIVC–XXIVC' of the FIG. 24A in a manufacturing step following the FIG. 24C according to the fourth embodiment of the present invention.

Here, the gate insulating layer 30, the semiconductor layer 40, and the ohmic contact layer 50 are not deposited on the gate portion of the peripheral areas, but the semiconductor layer 40, and the ohmic contact layer 50 may be deposited as shown in FIG. 27. Of course, the conductor layer 60 may be not deposited on the gate pad portion by using the shadow frame 100, not shown in drawings.

Figure 28A:
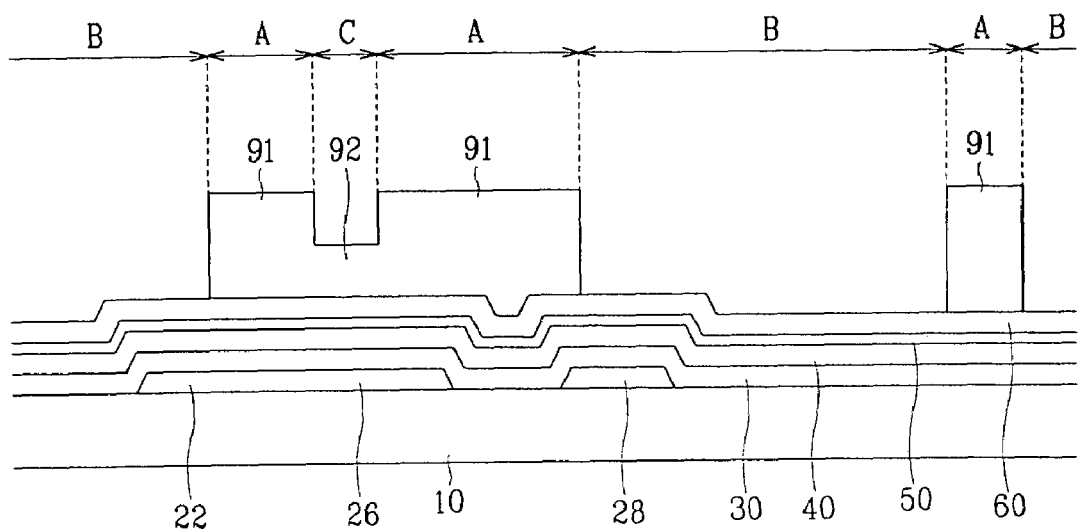
FIGS. 28A and 28B are the cross-sectional views respectively taken along the line XXIVB–XXIVB' and XXIVC–XXIVC' of the FIG. 24A in a manufacturing step following the FIGS. 25A and 25B.
Figure 28B:
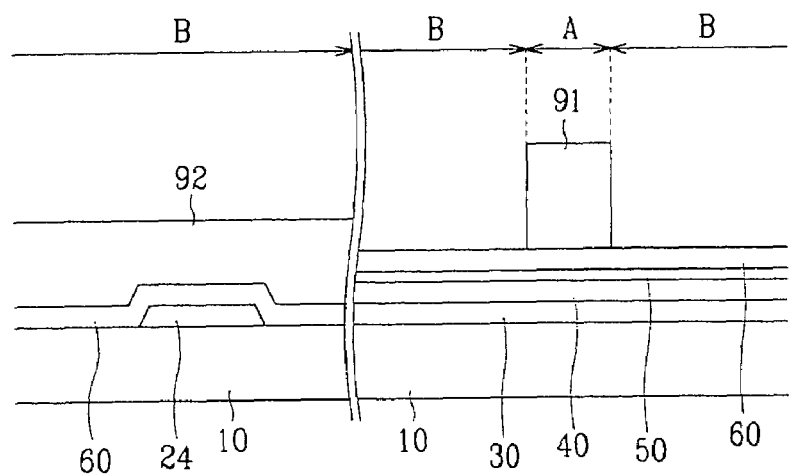

Thereafter, the photoresist layer 90 is exposed to light through a second mask and developed to form a photoresist pattern 91 and 92 as shown in FIGS. 28A and 28B. At this time, the first portion 92 of the photoresist pattern located between a source electrode 62 and a drain electrode 63, i.e., a thin film transistor channel part C as shown in FIG. 24A, is thinner than the second portion 91 of photoresist pattern located over the data wire portion A where a data wire 61, 62, 63 and 64 will be formed, and the third portion, the remaining portion of the photoresist pattern located at portion B, has almost no photoresist pattern left. The third portion may have a thickness depending on the etching method. For example, the third portion has substantially zero thickness when using a wet etch, but the third portion may have non-zero thickness when using a dry etch. At this time, the thickness ratio between the first portion 92 and the second portion 91 depends on the etch condition that will be described later. However, it is preferable that the thickness of the first portion 92 is equal to or less than half of that of the second portion 91. Here, it is preferable that the second mask has a light transmission of 3% or less corresponding to the area of a data line assembly and a pixel electrode line assembly, a light transmission of 20–60%, more preferably 30–40%, corresponding to the TFT channel area, and a transmission of 90% or more. The thickness of the first portion 92 is in the range of 2,000–5,000 Å, more preferably 3,000–4,000 Å, and the thickness of the second portion 91 is in the range of 1.6 to 1.9 μm, in the case of using positive photoresist.

Figure 29:
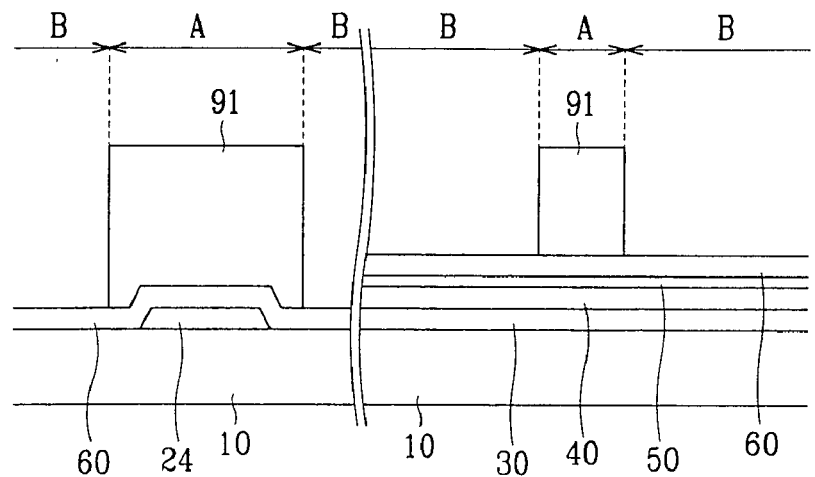
FIGS. 29 to 31 are the cross-sectional views taken along the line XXIVC–XXIVC' of the FIG. 24A in a manufacturing step following the FIG. 25C according to the fifth, the sixth and the seventh embodiments of the present invention, respectively.

As shown in FIG. 28, the first portion 92 is not etched out on the gate pad portion, because the gate pads 23 is to be exposed in the steps of forming the semiconductor pattern 41, the data line assembly 61, 62, 63 and 64, and the pixel electrode line assembly 65 and 66. However, the photoresist may be completely removed. Nonetheless, it is preferable that the first portion 92 is not etched out on the gate pad portion to prevent the gate pads 23 from being damaged in later etch processes. Furthermore, as shown in FIG. 29, a thicker photoresist pattern such as the second portion 91 may remain on the portion of the gate pad portion to form a pad buffer layer covering the gate pads 23 with the same layer as the data line assembly 61, 62, 63 and 64 without depositing the gate insulating layer 30, the semiconductor layer 40, and the ohmic contact layer 50.

Figure 30:
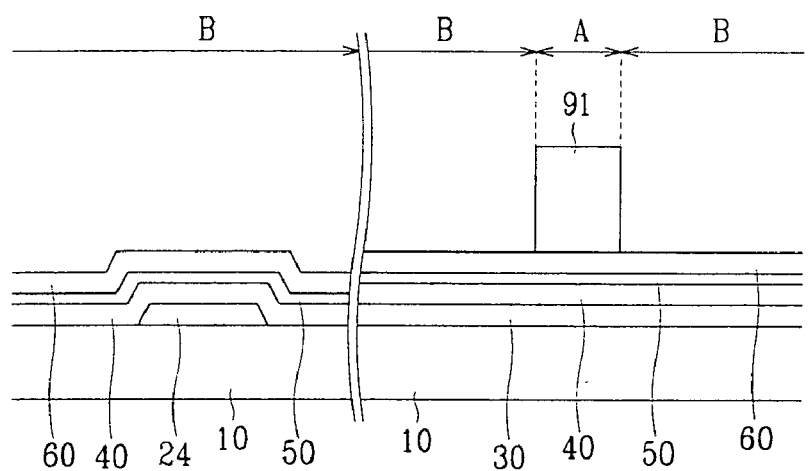
Figure 31:
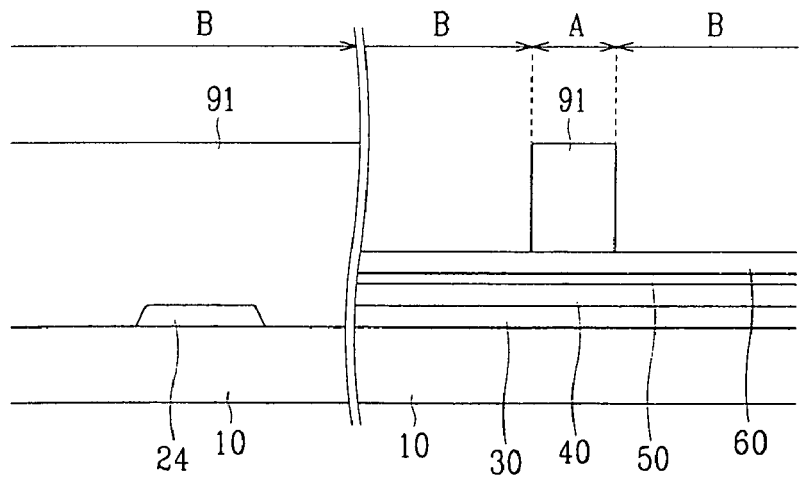

Furthermore, when depositing the semiconductor layer 40 on the gate pad portion of the peripheral areas as shown in FIG. 27, the photoresist on the gate portion of the peripheral areas is removed to expose the gate pads 23, as shown in FIG. 30. On the other hand, when not depositing the conductor layer 60 on the gate pad portion by using the shadow frame, a photoresist pattern such as the second portion 91 having the thicker thickness may be remained on the gate pad portion, as shown in FIG. 31.

There are methods controlling the amount of incident light by forming a pattern such as a slit or a lattice, which is smaller than the resolution of the exposure device, or by providing a partly-transparent layer on the mask to form the photoresist pattern 91 and 92 having the different thickness depending on the position. When manufacturing a mask using partly-transparent layer, a thickness of the partly-transparent layer may be controlled, or the partly-transparent layer having multi-layered structure made of a plurality of layers having a different transmittance may be used, to control the amount of incident light.

Another method to vary the thickness of the photoresist layer employs reflow. Here, a photoresist layer is exposed to light through a mask having substantially transparent portions and substantially opaque portions, respectively, to form a photoresist pattern having portions of zero and nonzero thicknesses. However, as described above, the portion of zero thickness may have a residual thickness of photoresist. The photoresist pattern is subject to reflow such that the thicker photoresist flows into the zero thickness portions to form a new photoresist pattern having a thinner thickness.

Referring back to FIGS. 28A and 28B, the photoresist pattern 91 and 92, and the layers thereunder including the conductor layer 60, the ohmic contact layer 50, and the semiconductor layer 40 are then subject to an etching process. When this is done, there may be left a data line assembly and the layers thereunder at the data line assembly part A, and only the semiconductor layer on the channel part C. In addition three layers 60, 50, and 40 in the remaining part B are removed from the gate insulating layer 30, and the gate pads 23 on the peripheral areas may be exposed.

Figure 32A:
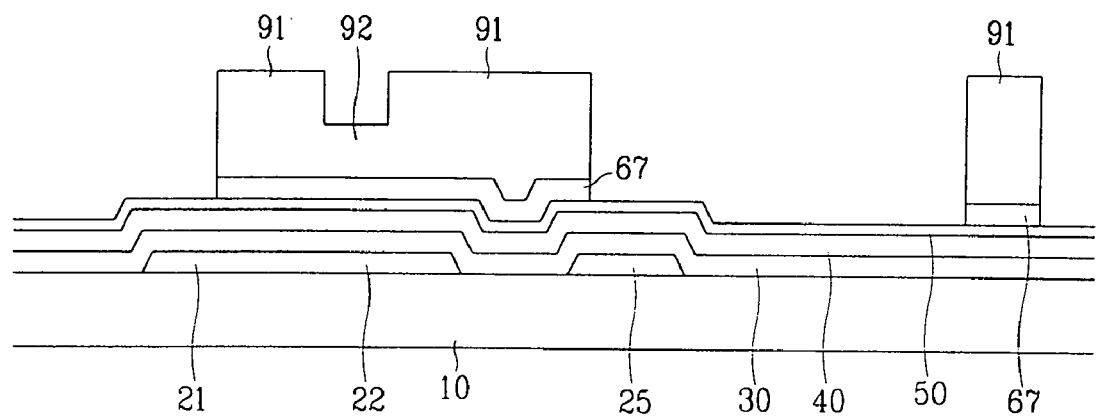
FIGS. 32A and 32B are the cross-sectional views respectively taken along the line XXIVB–XXIVB' and XXIVC–XXIVC' of the FIG. 24A in a manufacturing step following the FIGS. 28A and 28B.
Figure 32B:
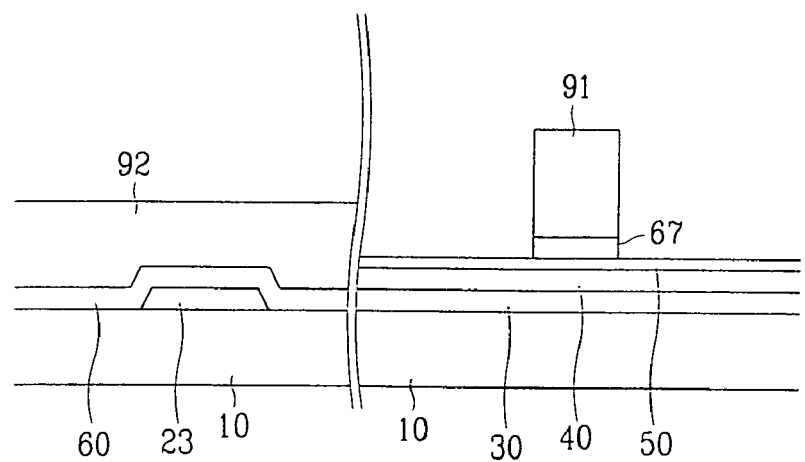

As shown in FIGS. 32A and 32B, the ohmic contact layer 50 of the part B is exposed by removing the conductor layer 60 thereon. At this time, both wet and dry etch can be used, and it is preferable that the conductor layer 60 is etched but the photoresist layer 91 and 92 are not etched. However, since dry etch is hard achieve this condition the photoresist pattern 91 and 92 may be also etched. In this case, the first portion 92 may be made thicker than in wet etch case so that the conductor layer 60 is not exposed.

The conductor layer 60 made of Mo or MoW alloy, Al or Al alloy, or Ta can be etched by dry or wet etch method. However, the conductor layer 60 made of Cr, is better etched by wet etch because Cr is not easily removed by dry etch. CeNHO$_3$ is available as wet etchant for etching Cr conductor layer 60. The mixed gas systems of CF$_4$ and HCl or CF$_4$ and O$_2$ is available for dry etching, a Mo or MoW conductor layer 60. In this case, the etch rate of the latter system on the photoresist layer is similar to that of the conductor layer 60.

Figure 33A:
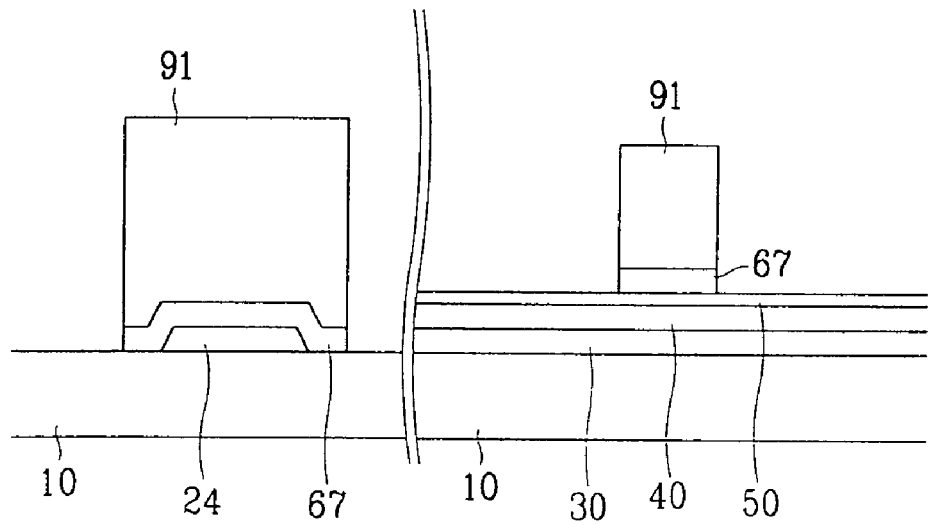
FIGS. 33A and 33B are the cross-sectional views taken along the line XXIVC–XXIVC' of the FIG. 24A in a manufacturing step following the FIGS. 29 and 30.
Figure 33B:
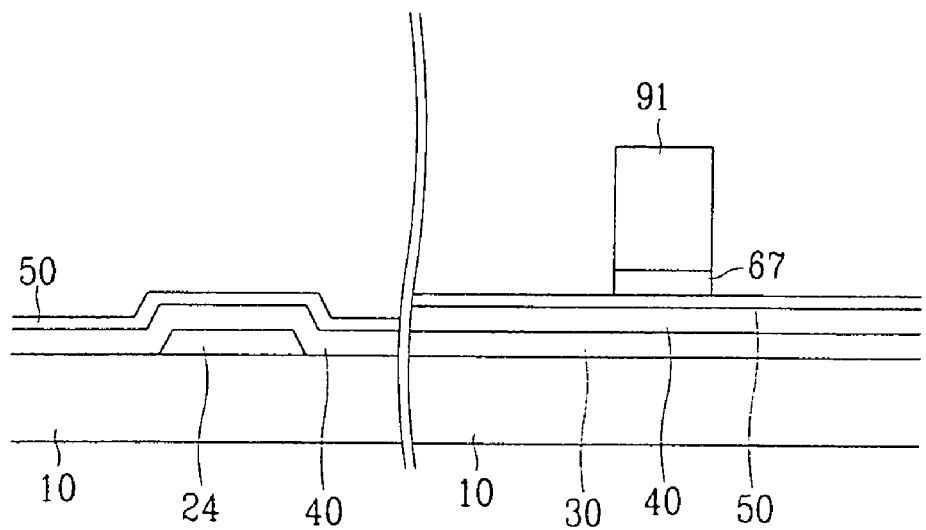

Referring to FIGS. 32A and 32B, as a result, only the portions 67 of the conductor 60 under the photoresist 91 and 92 at the channel part C and the data wire part B for source/drain electrodes are left, and the remaining portion of the conductor layer 60 at part B is wholly removed to expose the ohmic contact layer 50 thereunder. At this time, the conductor pattern 67 has the same layout as the data line assembly parts 61, 62, 63 and the pixel electrode line assembly 65 and 66 except that the source electrode 62 and the drain electrode 63 are connected to each other. When dry etch is used, the photoresist layer 91 and 92 is also etched to a certain thickness. At this time, the conductor pattern 67 covering the gate pads 23 may remain as shown in FIG. 33A in the case of forming the photoresist pattern 91 as shown in FIG. 29, and the semiconductor layer 40 and the ohmic contact layer 30 may remain as shown in FIG. 33B in the case of removing the photoresist as shown in FIG. 30.

Figure 34A:
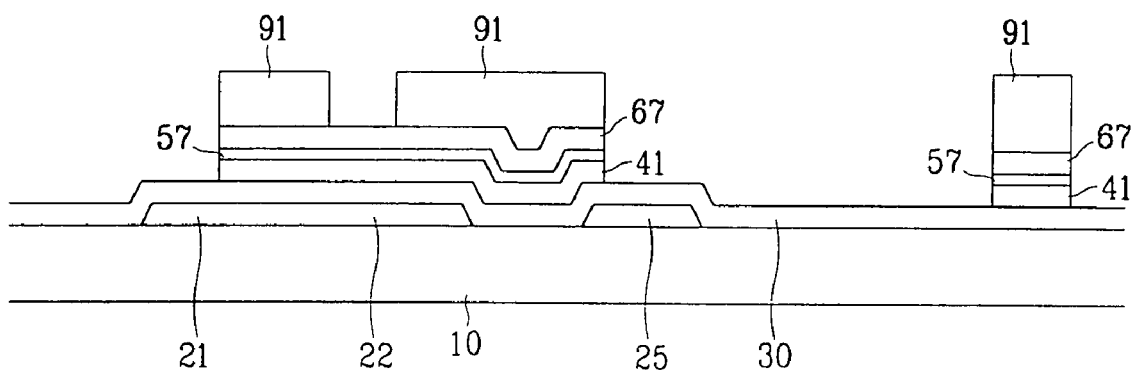
FIGS. 34A and 34B are the cross-sectional views respectively taken along the line XXIVB–XXIVB' and XXIVC–XXIVC' of the FIG. 24A in a manufacturing step following the FIGS. 32A and 32B.
Figure 34B:
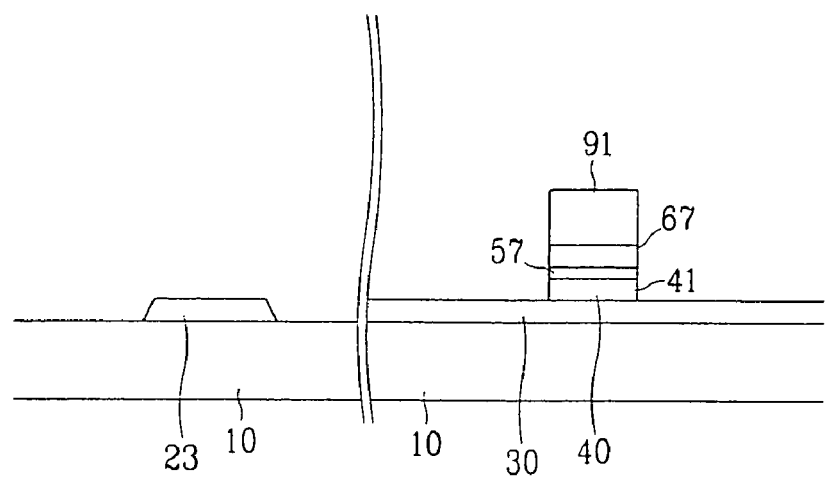

Next, the exposed portions of the ohmic conductor layer 50 at part B and the semiconductor layer 40 thereunder of FIGS. 32A and 32B have been removed by dry etching along with first portion 92 of the photoresist layer as shown FIGS. 34A and 34B. The etch condition may be such that the photoresist pattern 91 and 92, the ohmic contact layer 50, and the semiconductor layer 40 are all etched (the semiconductor layer and the ohmic contact layer have almost the same etch rate), but the gate insulating layer 30 is not etched. It is preferable that the etch rates of the photoresist patterns 91 and 92 and the semiconductor layer 40 are almost the same. This occurs example with the mixed gas systems of $SF_6$ and HCl or $SF_6$, and $O_2$. When the etch rates of the photoresist patterns 91 and 92 and the semiconductor layer 40 are almost the same, the thickness of the first portion 92 may be equal to or less than the sum of the thicknesses of the semiconductor 40 and the ohmic contact layer 50.

Figure 35A:
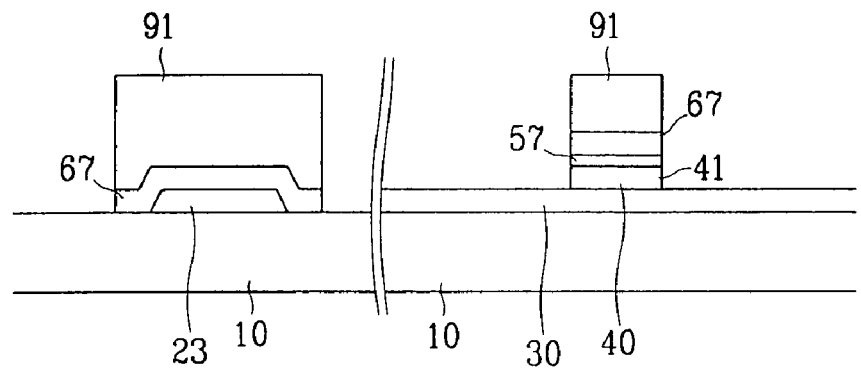
FIGS. 35A to 35C are the cross-sectional views taken along the line XXIVC–XXIVC' of the FIG. 24A in a manufacturing step following the FIGS. 33A, 31 and 33B, respectively.
Figure 35B:
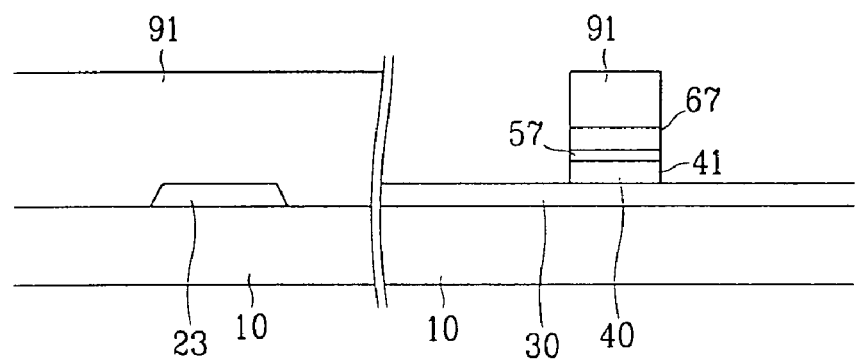
Figure 35C:
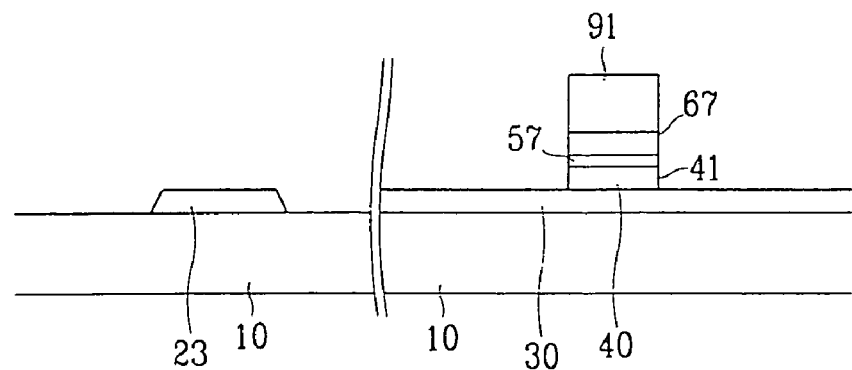

Then, as shown in FIGS. 34A and 34B, the conductor pattern 67 is exposed by removing the first portion 92 of the channel part C, the gate insulating layer 30 is exposed by removing the ohmic contact layer 50 and the semiconductor layer 40 of the part B, and the gate pad 23 is exposed. At the same time, the thickness of the second portion 91 over the data wire part A is reduced by etching. Furthermore, the completed semiconductor pattern 41 is obtained at this step. The reference numeral 57 represents the ohmic contact layer pattern under the conductor pattern 67 for the source/drain electrodes. Here, the thickness of the second portion 91 over the gate pad portion is reduced by etching as shown in FIGS. 33A and 31 in case of remaining the second portion 91 as shown in FIGS. 33A and 31, and the gate pad 23 is exposed as shown in FIG. 35C in the case of forming the semicoductor layer 40 and the ohmic contact layer 50 as shown in FIG. 33B.

The remaining photoresist layer on the conductor pattern 67 is then removed by ashing or plasma etching.

Plasma gas or microwaves are used in the ashing step, and oxygen is an example of the compositions mainly used.

Next, as shown in 21 and 23 the conductor pattern 67 for source/drain electrodes at the channel part C and the ohmic contact layer pattern 57 for source/drain electrodes of FIG. 34A are removed by etching. At this time, it is possible either to etch both the conductor pattern 67 and the ohmic contact layer 57 by a dry etching method, or to etch the conductor pattern 67 by a wet etching method and the ohmic contact layer 57 by a dry etching method. It is preferable in the former case that the etch conditions having a large etch selectivity between the conductor pattern 67 and the ohmic contact layer pattern 57 is employed. This is because if the etch selectivity is not large enough, it is hard to detect the end point of the etch and to control the thickness of the semiconductor pattern 41 around the channel part C. This can be achieved by using a mixed gas system of $SF_6$ and $O_2$ for example. When doing the wet etching and the dry etching sequentially, the lateral sides of the conductor pattern 67 subject to wet etching are also etched but those of the ohmic contact layer pattern 57 that is dry etched are hardly etched at all. Thereby, the profile of these two patterns 67 and 57 makes a step like form. The mixed gas systems of $CF_4$ and $O_2$ are examples of an etch gas system for etching the ohmic contact layer pattern 57 and the semiconductor pattern 41. The semiconductor pattern 41 may also be formed to have a uniform thickness by etching with the mixed gas system of $CF_4$ and $O_2$. At this time, the thickness of the semiconductor pattern 41 may be reduced and the second portion 91 of photoresist pattern is also etched to a certain thickness. The etch conditions may also be set not to etch the gate insulating layer 30 and the gate pad 23, and it is preferable to make the photoresist pattern thick enough not to expose the data line assembly 61, 62, 63 and 64.

As a result, the source electrode 62 and the drain electrode 63 are divided, and the complete data wire parts 61, 62, 63 and 64 and the completed contact layer pattern 51 and 52 thereunder are obtained.

Next, the remaining second portion 92 of the photoresist layer on the data line assembly is removed. However, the second portion 92 may be removed after removing the conductor pattern 67 for source/drain electrodes on the channel part C and before removing of the ohmic contact layer pattern 57 under the conductor pattern 67.

In summary, this process can be done by using both wet etching and dry etching in turn, or by using only dry etching.

In the former case, the conductor layer of the part B is first removed by wet etching, and the ohmic contact layer and the semiconductor layer thereunder are removed by dry etching. At this time, the photoresist layer of the part C is consumed to a certain thickness, and the part C may have or may not have any residual photoresist, which substantially depends on the initial thickness of the photoresist layer of the part C. When the part C has residual photoresist, the residual photoresist is removed by ashing. Finally, the conductor layer of the part C is wet etched to separate the source and the drain electrodes, and the ohmic contact layer of the part C is removed by using dry etching.

In the latter case, the conductor layer, the ohmic contact layer and the semiconductor layer of the part B are removed by dry etching. As the former case, the part C may have or may not have residual photoresist, and the residual photoresist is removed by ashing when the part C has residual photoresist. Finally, the conductor layer of the part C is dry etched to separate the source and the drain electrodes, and the ohmic contact layer of the part C is removed by using dry etching.

Also, if the data line assembly is etched, the semiconductor pattern, the contact layer pattern and the data wire may be completed in one step. In other words, it is desirable that the photoresist pattern 92 and the contact layer 50 thereunder of the part C are dry etched, and the portion of the photoresist pattern 91 of the part A is dry etched during dry etching the conductor layer, the ohmic contact layer, and the semiconductor layer of the part B.

Since the latter process uses only one type of etching method, it is simpler but it is hard to achieve proper etching conditions. On the contrary, the former process has the advantage of ease of achieving proper etching condition, but it is more complicated.

In this embodiment according to the present invention, the semiconductor pattern 41 has the same layout as that of the data line assembly 61, 62, 63 and 64, and the pixel electrode line assembly 65 and 66, but the semiconductor pattern 41 may be extended outside the circumference of the data line assembly 61, 62, 63 and 64, or the pixel electrode line assembly 65 and 66 by remaining the second portion 91 of the photoresist pattern at the circumference of the first portion 91 of the photoresist pattern.

Furthermore, a passivation layer covering the data line assembly 61, 62, 63 and 64, the pixel electrode line assembly 65 and 66, and the semiconductor pattern 41 may be formed, and the shadow frame having the blocking deposition area may be used to prevent the passivation layer from being deposited on the gate pad and the data pad portions of the peripheral areas.

In this embodiment according to the present invention, because the shadow frame is used to prevent the gate insulating layer from being deposited on the peripheral area, the TFT array substrate for the LCD is manufactured by using two masks including one to form the gate line assembly and the pixel electrode line assembly, the other to form the data line assembly, the pixel electrode line assembly and the semiconductor pattern.

As described above, the pixel electrodes, the data line assembly and the semiconductor pattern are formed at only one photolithography process, and the shadow frame is used to prevent the gate insulating layer from being deposited on the peripheral area, thereby simplifying the processing steps and reducing the production cost. Furthermore, the subsidiary data lines are formed at the same plane as the gate line assembly with the same material, and the semiconductor pattern and the contact holes exposing the subsidiary data lines are formed in only one photolithography process, thereby preventing the data lines from being cut and simplifying the processing steps.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A thin film transistor (TFT) array substrate, comprising:
a substrate;
a gate wiring pattern formed on the substrate and comprising a plurality of gate lines and a plurality of gate electrodes;
a common wiring pattern formed on the substrate and comprising a plurality of common signal lines and a plurality of common electrodes;
a plurality of redundant lines formed on the substrate, the plurality of redundant lines disposed on the same layer as the plurality of gate lines;
a gate insulating layer covering the gate lines and the common electrode lines and having a plurality of contact holes exposing the redundant lines;
a semiconductor layer formed on the gate insulating layer;
a data wiring pattern comprising a plurality of data lines, a plurality of source electrodes and a plurality of drain electrodes, the data lines being connected to the redundant lines; and
a plurality of pixel electrodes connected to the drain electrodes and proceeding parallel to the common electrodes.

2. The TFT array substrate of claim 1, wherein the semiconductor layer has the same line shape as the data lines.

3. The TFT array substrate of claim 1, wherein a portion of the gate insulating layer has the same boundary as the semiconductor layer.

4. The TFT array substrate of claim 1, wherein a portion of the gate insulating layer has the same boundary as the data line.

* * * * *